United States Patent
Sugawara

[11] Patent Number: 5,892,474
[45] Date of Patent: Apr. 6, 1999

[54] CLOCK PHASE ACQUISITION/TRACKING DEVICE AND PHASE ACQUISITION METHOD

[75] Inventor: Takao Sugawara, Kawasaki, Japan

[73] Assignee: Fujitsu Limited, Kawasaki, Japan

[21] Appl. No.: 944,888

[22] Filed: Oct. 6, 1997

[30] Foreign Application Priority Data

Feb. 26, 1997 [JP] Japan .................................. 9-042760

[51] Int. Cl.⁶ ...................................................... H03M 1/00
[52] U.S. Cl. .............................................................. 341/200
[58] Field of Search .................................... 341/111, 118, 341/155, 200

[56] References Cited

U.S. PATENT DOCUMENTS 4,754,260  6/1988  Nelson et al. ........................... 341/155

FOREIGN PATENT DOCUMENTS 52-127053  10/1977  Japan .
3046413    2/1991   Japan .
7220406    8/1995   Japan .

OTHER PUBLICATIONS

A PRML System for Digital Magnetic Recording; by Roy D. Cideciyan, et al., IEEE Journal on Selected Areas in Communications, vol. 10, No. 1, pp. 38–56; Jan. 1992.

Primary Examiner—Brian Young
Attorney, Agent, or Firm—Greer, Burns & Crain, Ltd.

[57] ABSTRACT

A clock phase acquisition/tracking device comprises a phase error operation section for operating a phase error of a quantized signal to a given quantization timing and a clock generation section for generating a clock at a given phase based on a phase error information operated in the phase error operation section. For the resulting quantized signal, a determination is made using a threshold set based on a previously quantized signal when the phase error is operated in the phase error operation section upon the beginning of the clock phase acquisition. Thus, the time necessary for the phase aquisition can be shortened.

35 Claims, 28 Drawing Sheets

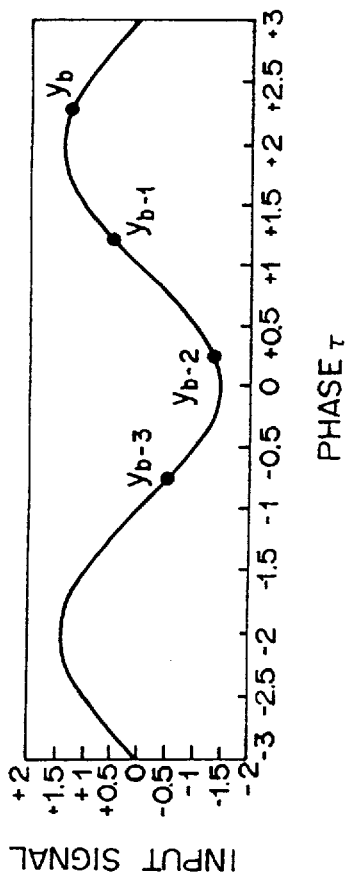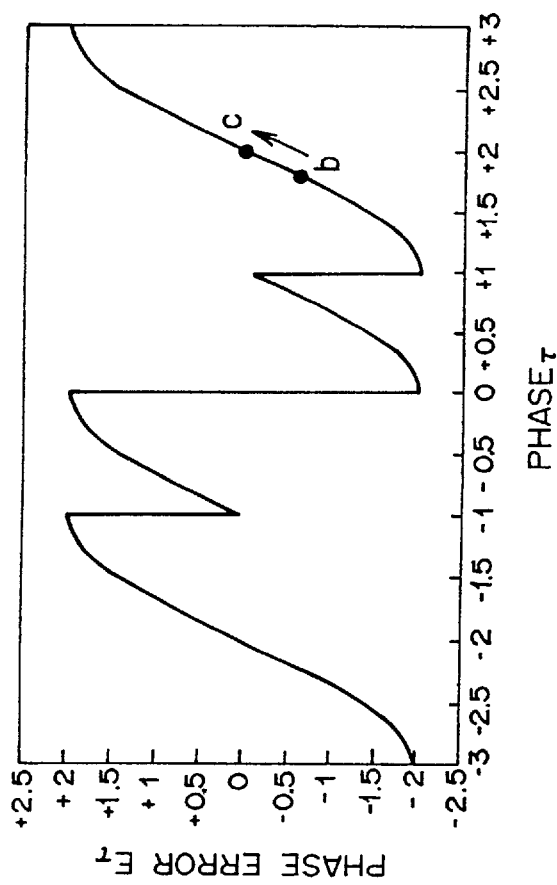
FIG. 7 (a)
FIG. 7 (b)

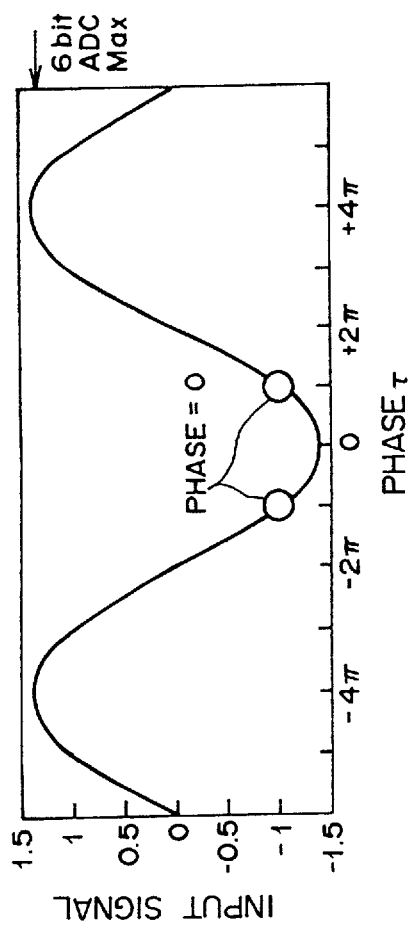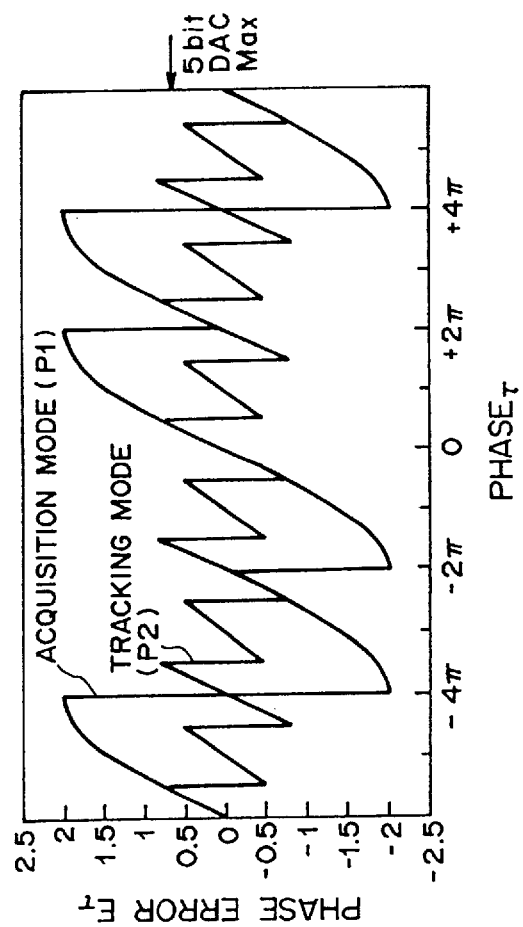
FIG. 20 (a)
FIG. 20 (b)

FIG. 27 (a) RELATED ART
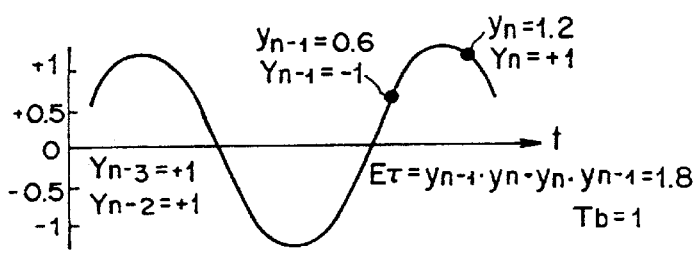
FIG. 27 (b) RELATED ART
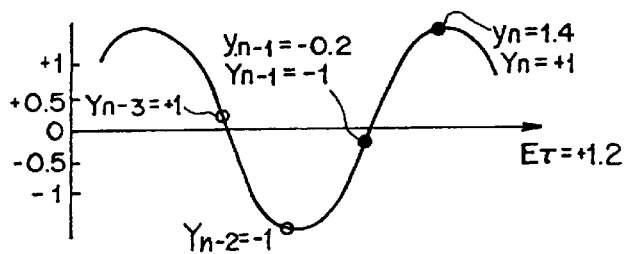
FIG. 27 (c) RELATED ART
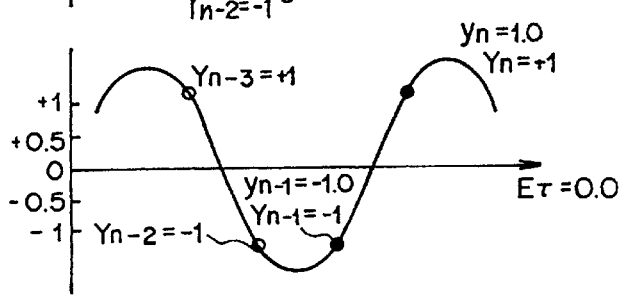
FIG. 27 (d) RELATED ART
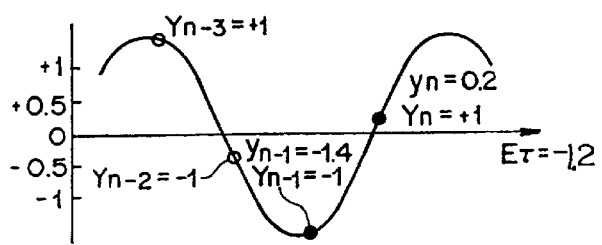
FIG. 27 (e) RELATED ART
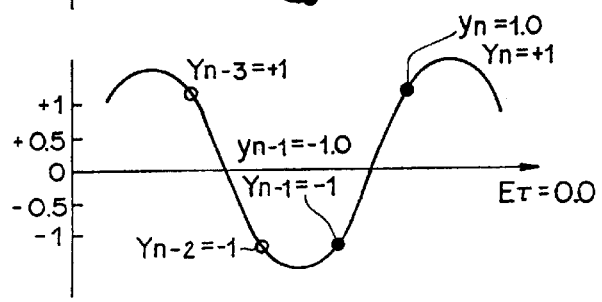

CLOCK PHASE ACQUISITION/TRACKING DEVICE AND PHASE ACQUISITION METHOD

BACKGROUND OF THE INVENTION

The present invention relates to a clock phase acquisition/tracking device and a method for phase acquisition for being appropriately used, for instance, to read data in magnetic recording devices or to regenerate received signals in communication devices.

In recent years, PRML (Partial Response Maximum Likelihood) method combining partial response and maximum likelihood detection is generally used for recording/regenerating method of a magnetic disk drive as a magnetic recording device for recording data using magnetic property on the disk. Namely, it is known that this PRML method is a signal processing technology indispensable for high-density recording of data on the disk.

FIG. 24 shows the composition of a data read section 100 of a magnetic disk drive to which the PRML method is applied. As shown in this FIG. 24, the amplitude of the (electric) signal regenerated by a head 101 is amplified by a preamplifier 102 or an AGC (Automatic Gain Control) 103.

Then, in the data read section 100, a signal from the AGC 103 is equalized to a constant signal presenting partial response by an equalizer such as pre-filter 104 or FIR (Finite Impulse Response) filter 106, and "0" or "1" of the signal is discriminated by a maximum likelihood detector 111.

Now, the pre-filter 104 is an analog filter as a signal processing circuit of continuous time, while the FIR filter 106 is a digital filter as a signal processing circuit of discrete time. An analog/digital converter (ADC) 105 for converting an analog signal into a digital signal is interposed between the pre-filter 104 and FIR filter 106. In other words, this ADC 105 quantizes signals from the pre-filter 104.

When the downstream section after the FIR filter 106 is a continuous time signal processing circuit (analog circuit), a sample holder for holding sampled data for a certain time is interposed as a quantization circuit.

In the ADC 105, an analog signal is converted into a digital signal based on a clock, and the phase of this clock is so adjusted that the quantization can be realized at a given timing from the output of the FIR filter circuit 106 by a PLL (Phase Locked Loop) circuit 112.

By this composition, in the PLL circuit 112, a phase error computation circuit 107 computes the phase error $E_\tau$ (phase error between clock phase generated by a VCO 110 and desired quantization timing) from the signal equalized by the FIR filter 106 (digital signal; $y_n$).

The phase error $E_\tau$ computed by the phase error computation circuit 107 is converted into an analog signal by a D/A converter (DAC) 108 and output, through a loop filter 109, to the voltage control oscillator (VCO) 110 for generating a clock signal.

The VCO 110 generates a clock signal using the phase error information $E_\tau$ from the loop filter 109 as control signal and the A/D conversion procession in the A/D converter 105 is executed based on this clock timing.

In other words, acquisition and tracking of the clock phase input as quantization timing in the A/D converter 105 can be achieved through the feedback, by the PLL circuit 112, from signal A/D-converted by the A/D converter 105.

Here, the clock phase acquisition mentioned above indicates a state wherein the PLL circuit 112 operates so that the phase error $E_\tau$ can be stable around 0 when this phase error $E_\tau$ computed by the phase error computation circuit 107 is unstable around 0. While clock phase tracking indicates a state wherein the phase error $E_\tau$ computed by the phase error computation circuit 107 is stable around 0 and the PLL circuit 112 operates so that the phase error $E_\tau$ remains around 0 thereafter.

When the clock phase acquisition operation is performed in the PLL circuit 112 of the data read section 100, in a head 101 as shown in FIG. 25, the acquisition operation is initiated (refer to time point t1) at a gap section (preamble section; refer to time points t1 to t3) recording a certain frequency on the disk and is completed (refer to time point t2) before the arrival of a data section (refer to time point t4 and thereafter) to enter the tracking operation (refer to time point t2 and thereafter).

It is known that a phase error computation circuit as shown in FIG. 26 can be adopted as the phase error computation circuit 107 upon achieving the phase acquisition operation.

Here, the phase error computation circuit 107 shown in FIG. 26 comprises a decision circuit 107a, three delay elements (D) 107b-1 to 107b-3, two multipliers 107c-1, 107c-2 and a subtracter 107d.

Here, the decision circuit 107a is a hysteresis type decision circuit for received signal ($y_n$; digital signal) quantized and equalized in the A/D converter 105 and the FIR filter 106, and for determining as binary digit (+1 or −1) its signal level (sample value) taking the previous (2 bits before) determination value $Y_{n-2}$ as threshold. The decision circuit 107a outputs the determination result as $Y_n$.

Delay elements 107b-1 to 107b-3 are designed to output the received signal delaying for 1 bit. Namely, the delay element 107b-1 is composed to output a signal $y_{n-1}$ past by 1 bit when the signal $y_n$ is input from the FIR filter 106.

Similarly, the delay element 107b-2 is composed to output a signal $Y_{n-1}$ by 1 bit past when the signal $Y_n$ is input from the decision circuit 107a thereto, while the delay element 107b-3 is made to output the signal $Y_{n-1}$ past by 1 bit to the decision circuit 107a when the signal $Y_{n-1}$ is input from the delay element 107b-2 thereto.

Now, the delay elements 107b-1, 107b-2, multipliers 107c-1, 107c-2 and the subtracter 107d compute the phase error $E_\tau$ by operation as shown by the following expression (1).

$$E_\tau = y_{n-1} \cdot Y_n - y_n \cdot Y_{n-1} \tag{1}$$

Suppose the signal input into the phase error computation circuit 107 when phase acquisition is initiated by the PLL circuit 112 is defined ($y_{n-3}$, $y_n$), the determination value ($Y_{n-3}$, $Y_{n-2}$) used for operations by the phase error computation circuit 107 is given as the initial setting value arbitrarily [for example (+1, +1)].

By using the phase error computation circuit 107 composed as mentioned above, in the PLL circuit 112, the phase acquisition is performed through the state transition on the time series as shown by the following FIG. 27(a) to FIG. 27(d). In this case also, ($Y_{n-3}$, $Y_{n-2}$)=(+1, +1) is given as the initial setting value.

First, as shown in FIG. 27(a), if the signal $y_{n-1}$ (sample value 0.6) is input to the phase error computation circuit 107 upon the initiation of phase acquisition by the PLL circuit 112 (sample value of the signal $y_n$ following $y_{n-1}$ is 1.2), the corresponding determination values from the decision circuit 107a will be $Y_{n-1}$=−1, $Y_n$=+1 respectively. Consequently, the phase error $E_\tau$ as an operation result will be 1.8.

By this, in this VCO 110, the phase of the clock generated is controlled so that this phase error $E_\tau=1.8$ becomes 0. In this case, the PLL circuit 112 acts in the direction to delay the phase. In other words, as the PLL circuit 112 determines $Y_{n-1}$ and $Y_n$ respectively as −1 and +1, it operates so that these come to the inherent position.

Thereafter, passing through the state (the phase error $E_\tau=+1.2$) where the sample value $(Y_{n-1}, y_n)=(-0.2, 1.4)$ is input as shown in FIG. 27(*b*), the state where the phase error $E_\tau$ is 0 as shown in FIG. 27(*c*) is attained.

However, as the phase error computed by this phase error computation circuit 107 is integrated by a loop filter 109 of the following stage, the charge accumulated in capacitors composing this loop filter 109 can not be discharged immediately, resulting in the stage where the phase is delayed too much as shown in FIG. 27(*d*).

Consequently, in the state where the phase error $E_\tau=0$ as shown in FIG. 27(*c*), the phase acquisition is not completed but the phase is being acquired continuously until attaining the state where the phase acquisition is completed (phase error $E_\tau=0$) as shown in FIG. 27(*e*) passing through the state where the phase error $E_\tau$ is −1.2 as shown in FIG. 27(*d*).

Namely, while the sample value is at the position of $(y_b, y_{b-1})$ as shown in FIG. 28(*a*), the phase τ and the phase error $E_\tau$ will take the value corresponding to the point b shown in FIG. 28(*b*).

In this state, by operating the PLL circuit 112 as a feed back loop, the A/D conversion timing by the A/D converter 105 is controlled, the phase τ and the phase error $E_\tau$ of the sample value approach the point passing though the value corresponding to the point b', and the phase acquisition is completed. At this time, the sample value will settle into the position $(y_{a-1}, y_a)$ shown in FIG. 28(*a*).

However, in the phase acquisition/tracking method by the PLL circuit adopting the phase error computation circuit as shown in FIG. 26, as the initial value of the determination value determined by the decision circuit 107*a* is given arbitrarily, the initialization is not made based on the input signal and there is a problem of requiring sometime, inconveniently, unnecessary time for phase acquisition.

To be more specific, while the point b indicating the phase error $E_\tau$ shown in FIG. 28(*b*) tries to approach the point a through the point b', considering the time necessary for the phase acquisition, the phase acquisition will be completed earlier if the PLL circuit 112 is operated so as to approach the point c where the phase acquisition is completed in the same way as the point a. Note that as the phase of the point c is integer "2" (position shifted by 720 degrees from the point a, position of phase "0"), it can be determined that the phase acquisition mode is completed.

Particularly in magnetic disk drives or the like, as the gap is recorded more previously than data is recorded for phase acquisition (refer to time points (t1) to (t3) in FIG. 25), when the phase acquisition time is longer, it takes a long time before reading out of data starts, and there is a problem of inconveniently deteriorating the response performance.

Moreover, if the gap section is made longer in response to a longer phase acquisition time, the unnecessary information should also be recorded, inconveniently decreasing the format efficiency.

SUMMARY OF THE INVENTION

The present invention devised in consideration of these inconveniences has an object of providing a clock phase acquisition/tracking device and a phase acquisition method for reducing the time necessary for the phase acquisition.

For this purpose, the present invention is characterized by a clock phase acquisition/tracking device for acquiring or tracking the phase of a clock for quantization of an input signal from a signal to which the quantization is made, comprising a phase error operation section for computing phase error to a given quantization timing of the quantized signal mentioned above and a clock generation section for generating the clock at the given phase based on a phase error information operated in the phase error operation section, wherein, as for the signal to which the quantization was made, the determination is made using a threshold set based on the previously quantized signal when the phase error is operated in the phase error operation section upon the beginning of the clock phase acquisition.

The phase error operation section can also comprise a determination section for receiving the quantized signal and for determining whether a sample value of the signal is bigger or smaller than a threshold, an operation section for operating the phase error using a determination result in the determination section and the sample value of the signal and for outputting the operation result to the clock generation section and, further, a threshold setting section for setting the threshold to be used when the determination is made in the determination section based on the quantized signal upon the beginning of the clock phase acquisition.

In this case, the threshold setting section may also be composed to set as the threshold the determination result of a sample value of a previous signal input previously to the sample value of the above-described signal when the clock phase is acquired.

Moreover, the threshold setting section can comprise a sign determination section for determining whether the signal sample value is bigger or smaller than a given sign determination reference value and, further, a switch section for setting as the threshold the determination result from the sign determination section upon the beginning of the clock phase acquisition and, on the other hand, for setting as the threshold the determination result of a sample value of a previous signal input previously to the above-described signal sample value upon the clock phase acquisition and, in this case, the given sign determination reference value can be adopted as the value for determining positive or negative sign of the signal.

Consequently, according to the present invention, the time necessary for the phase acquisition can be reduced by determining, as for the quantized signal, using the threshold set based on the previously quantized signal, when the phase error is operated in the phase error operation section at the beginning of clock phase acquisition, so the response performance of the device can be improved.

The threshold setting section may also comprise a switch section for setting in the determination section a value for sign determination at the signal sample value upon the beginning of the clock phase acquisition and, on the other hand, for selecting the determination results of a sample value of a signal input previously to the sample value above-mentioned in the phase acquisition.

In consequence, in the present invention, the provision of a switch section makes it unnecessary to provide a plurality of decision circuits, and it allows advantageously to minimize the circuit size.

The clock generation section may also be composed to generate a plurality of clocks having different phases than each other and it may comprise a clock selection section for outputting selectively the plurality of clocks based on a level of the quantized signal; in this case, the plurality of clocks having different phases than each other can also be two clocks having an antiphased relation with each other.

Consequently, according to the present invention, the provision of a clock generation section for generating a plurality of clocks having different phases an each other and a clock selection section allows to output selectively, based on the level of quantized signal, to the quantization section either of two clocks having antiphased relation with each other so as to, advantageously, reduce remarkably the time necessary for the phase acquisition.

Moreover, the threshold setting section can be composed to set by switching the threshold of the determination section to the threshold for clock phase tracking upon the completion of the clock phase acquisition; in this case, the threshold for clock phase tracking can be set to a value permitting the three-valued determination.

Thus, according to the present invention, upon the completion of the clock phase acquisition, the threshold setting section is able to set the threshold of the determination section by switching to the threshold for clock phase tracking and, the threshold for clock phase tracking is able to take a value permitting the three-valued determination so as to, advantageously, perform the phase tracking effectively while making common with the determination section upon the phase acquisition.

Now, the clock phase acquisition/tracking device of the present invention is characterized by a clock phase acquisition/tracking device for acquiring or tracking the phase of a clock for the quantization of the input signal from the signal to which the quantization was made, comprising a clock generation section for generating a plurality of clocks having different phases than each other, a determination section for receiving the signal quantized by the clock from the clock generation section, an operation section for operating phase error between the quantized signal and a given quantization signal using the determination result in the determination section and the signal sample value and for outputting the phase error information as phase control information to the clock generation section, and a clock decision section for defining any one of the plurality of clocks as the clock for performing the clock phase tracking based on the determination result from the determination section when the clock phase acquisition is stabilized.

It is also characterized by that the plurality of clocks having different phases than each other are composed to be two clocks having antiphase relation with each other and that the threshold in the determination section is composed to be set to a value allowing the three-valued determination.

Thus, according to the present invention, by comprising a clock generation section for generating two clocks having antiphased relation with each other, a determination section for the three-valued determination, an operation section and a clock decision section, only one three-valued decision circuit may be used as the determination section for operating the phase error so as to simplify the circuit composition. The cost for composing the device can be reduced.

Moreover, the clock phase acquisition/tracking device of the present invention is characterized by a clock phase acquisition/tracking device for acquiring or tracking of the phase of a clock for the quantization of the input signal from the signal to which the quantization was made, comprising a phase error operation section for operating phase error between the quantized signal and a given quantization signal and a clock generation section for generating the clock at the given phase based on the phase error information operated by the phase error operation section, wherein the phase error operation section comprises a determination section for determining whether the signal sample value is bigger or smaller than the threshold, an operation section for operating the phase error using the determination result in the determination section and the signal sample value and for outputting the operation result to the clock generation section and, further, a threshold setting section for setting a sample value of previously input signal upon the phase clock acquisition and for setting a value enabling the multi-valued determination upon the phase clock tracking.

Consequently, according to the clock phase acquisition/tracking device of the present invention, the provision of a switch section enables the clock to make common the decision circuit for the phase acquisition and for phase tracking and so contributes remarkably to the reduction of the device size.

In the clock phase acquisition/tracking device of the present invention mentioned above, it is able to be composed to perform the clock phase tracking from the signal obtained as the result of the desired signal processing after the quantization upon the completion of the phase acquisition, and the desired signal processing after the quantization may also be the equalization.

Thus, according to the present invention, as the clock phase tracking may be performed from the signal obtained as the result of the equalization processing after the quantization, the loop delay produced by the equalization processing may not affect the properties of the phase synchronization and, particularly when the delay of the PLL loop is important, the prolongation of the time required for the phase acquisition may advantageously be minimized.

A maximum likelihood detector for detecting the maximum likelihood of the equalized signal may be provided so that the phase error operation section may operate the phase error using the detection result from the maximum likelihood detector and the signal sample value upon performing the clock phase tracking.

Consequently, according to the present invention, on the occasion of performing clock phase tracking, the phase error operation section is able to operate the phase error using the detection result from the maximum likelihood detector and the signal sample value, the determination value accuracy and the phase tracking accuracy are remarkably improved.

Moreover, it may be composed so as to quantize the input signal by an analog/digital converter for converting analog signals into digital signal, and a digital/analog converter for converting a digital signal into an analog signal as for the phase error information from the phase error operation section can be disposed at the upstream stage of the clock signal generation section.

In this case, a limiter circuit for limiting the maximum value of phase error information from the phase error operation section can be disposed at the upstream stage of the digital/analog converter, and as this permits the reduction of the number of bits to be treated by the digital/analog converter while maintaining the circuit performance of phase acquisition, a simplified digital/analog converter may be adopted so as to cut the cost for composing the device.

A bits number limitation section for limiting the bits number of the phase error information from the phase error operation section and a phase error information selection section for outputting selectively the phase error information of which bits number is limited by the bits number limitation section upon the phase acquisition and for outputting selectively the phase error information from the phase error operation section upon the phase tracking can be disposed at the upstream stage of the digital/analog converter.

According to the present invention, as the bits number limitation section and the phase error information selection section are provided at the upstream stage of the digital/ analog converter, the bits number of phase error information upon the phase acquisition may be limited to n bits while maintaining the circuit performance required for the phase acquisition. On the other hand, the bits number treated in the digital/analog converter may be reduced by outputting only the low order bit as it is by neglecting the high order bit upon the phase tracking so a simplified digital/analog converter may be adopted, and it is possible to cut the cost for composing the device.

In the case mentioned above, a bits number limitation section for limiting the bits number of the phase error information from the phase error operation section, a limiter circuit for limiting the maximum value of phase error information from the phase error operation section, and a phase error information selection section for outputting selectively the phase error information from the bits number limitation section upon the phase acquisition and for outputting selectively the phase error information from the limiter circuit upon the phase tracking may be disposed at the upstream stage of the digital/analog converter.

Consequently, according to the present invention, as the bits number limitation section, the limiter circuit and the phase error information selection section are provided at the upstream stage of the digital/analog converter, the bits number of phase error information upon the phase acquisition may be limited while maintaining the circuit performance required upon the phase acquisition. On the other hand, the necessary limiter processing is made output upon the phase tracking, the bits number treated in the digital/ analog converter can be reduced. So a digital/analog converter simplified correspondent to necessity may be adopted allowing to cut the cost for composing the device.

The phase acquisition method of the present invention is a method for acquiring from a quantized signal a clock phase for quantization of an input signal. This method comprises steps of: determining, regarding a sample value of a signal quantized based on a clock signal, as a threshold a sample value of a signal previous to the signal sample value;

operating a phase error between a given phase and a sample phase of the signal using the determination result of the determining step and the sample value of the input signal; controlling a phase of the clock signal based on a phase error information operated in the operating step; and initializing the threshold according to the sample value of the quantized signal when the determination is initiated in the determining step.

Thus, according to the present invention, at the beginning of the clock phase acquisition, as the determination concerned with the quantized signal is performed using the threshold set based on the signal quantized previously when the phase error is operated in the phase error operation section, the time required for the phase acquisition can be reduced allowing an improvement in the response performance of the device.

BRIEF DESCRIPTION OF THE DRAWINGS

Both

FIG. 7(a), FIG. 7(b), FIG. 8(a) to FIG. 8(d) are diagrams for illustrating the operation of the first embodiment of the invention respectively.

FIG. 20(a) and FIG. 20(b) both are diagrams for illustrating the phase error variation by the clock phase acquisition and clock phase tracking.

FIG. 27(a) to FIG. 27(e) are all diagrams for illustrating the state for performing the clock phase acquisition by the data read section having the composition of essential parts shown in FIG. 26.

DESCRIPTION OF THE PREFERRED EMBODIMENTS (a) Description of the aspect of the present invention First, the aspect of the present invention will be described referring to attached drawings.

Figure 1:
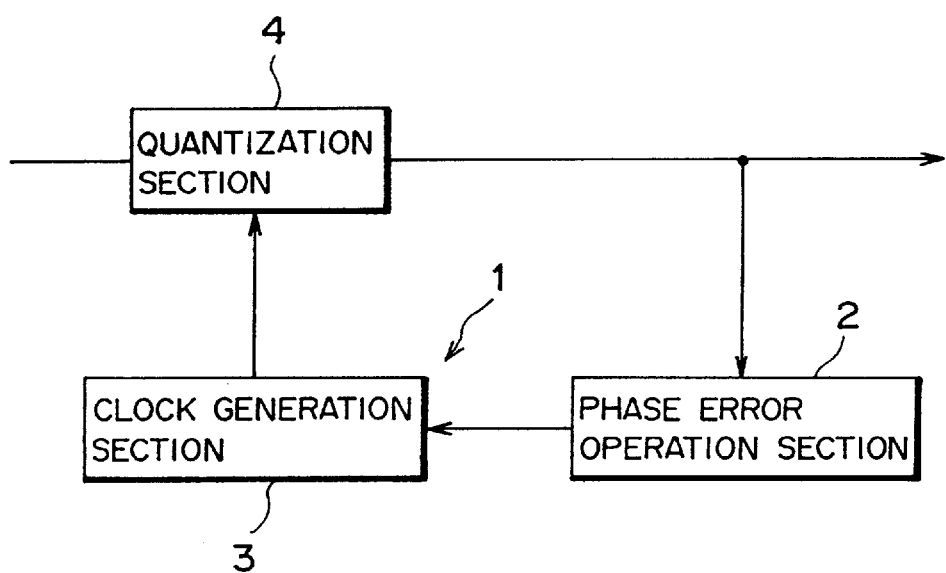
FIG. 1 and FIG. 2 are block diagrams showing an aspect of the invention respectively.

FIG. 1 is a block diagram showing an aspect of the present invention. In this FIG. 1, numeral 1 indicates a clock phase acquisition/tracking device and this clock phase acquisition/ tracking device 1 is designed to acquire or track from a quantized signal a clock phase for quantizing an input signal in a quantization section 4 and comprises a phase error operation section 2 and a clock generation section 3.

Here, the phase error operation section 2 is designed to operate a phase error between a given quantization timing and the quantized signal, while the clock generation section 3 is made to generate the clock at a given phase based on a phase error information operated by the phase error operation section 2.

The phase error operation section 2 is composed to determine the quantized signal using a threshold set according to a previously quantized signal in the operation of phase error at the beginning of the clock phase acquisition.

In this case, the phase error operation section 2 may comprise a determination section for receiving the quantized signal to determine whether a sample value of the signal is bigger or smaller than a threshold, an operation section for operating the phase error using the determination results in the determination section and the signal sample value and for outputting the operation result to the clock generation section, and a threshold setting section for setting a threshold to be used upon the determination in the determination section based on the quantized signal when the clock acquisition is initiated.

The threshold setting section can be composed to set as the threshold the determination result about a sample value of a signal input before the signal (quantized signal) sample value upon the clock phase acquisition.

Moreover, the threshold determination section may comprise a sign determination section for determining whether the signal sample value is bigger or smaller than a given sign determination reference value, and a switch section for setting as the threshold the determination result from the sign determination section upon the beginning of the clock acquisition and for setting as the threshold the determination result about the sample value of a signal input before the signal sample value upon the clock phase acquisition.

In this case, the given sign determination reference value can be taken as the value for determining the positive/negative sign of the signal.

Additionally, the threshold setting section may comprise a switch section for setting in the determination section the value for sign determination about the signal sample value upon the beginning of the clock phase acquisition and for selecting the determination result about the sample value of a previous signal input before the signal sample value upon the phase acquisition.

The clock generation section may be composed to generate a plurality of clocks having different phases than each other and to comprise a clock selection section for outputting to the quantization section selectively the plurality of clocks based on the level of the signal quantized by the quantization section and, in this case, the plurality of clocks having different phases than each other can be two clocks having antiphase relation each other.

The threshold setting section can be set by switching the threshold of the determination section to the threshold for the clock phase tracking upon the completion of the clock phase acquisition and, in this case, the threshold set for the clock phase tracking can be composed to be a value allowing the three-valued determination.

Figure 2:
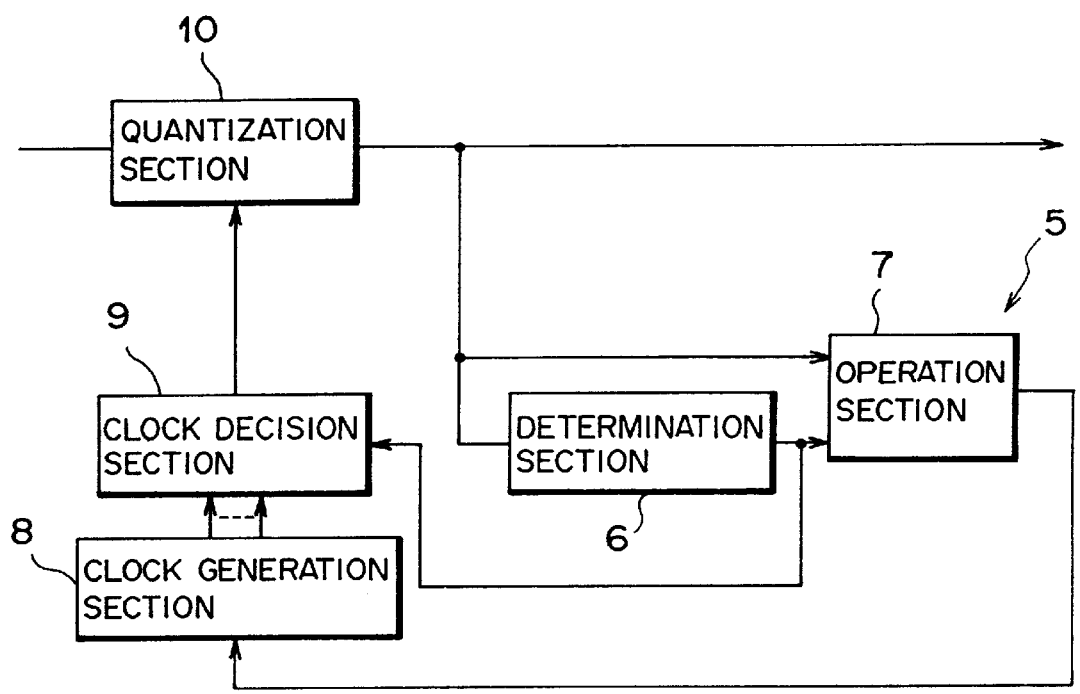

FIG. 2 is a block diagram showing an aspect of the present invention. In this FIG. 2, numeral 5 indicates a clock phase acquisition/tracking device that is designed to acquire or track from a quantized signal the clock phase for the quantization of the input signal by the quantization section 10 and comprises a determination section 6, an operation section 7, a clock generation section 8 and a clock decision section 9.

In this composition, the clock generation section 8 is composed to generate a plurality of clocks having different phases from each other, while the determination section 6 is composed to receive signal quantized by the clock from the clock generation section 8 and to perform the multi-valued determination of the signal sample value using a given threshold.

Moreover, the operation section 7 is made to operate the phase error to a given quantization timing about the quantized signal using the determination result in the determination section and the signal sample value, and to output the phase error information as phase control information to the clock generation section 8.

Moreover, the clock decision section 9 is designed to decide any one of the plurality of clocks as a clock for performing the clock phase tracking based on the determination result from the determination section 6 when the clock phase acquisition is stabilized.

In this case, the plurality of clocks having different phases from each other may be two clocks having antiphased relation to each other and the threshold at the determination section 6 can be set to a value allowing performance of the three-valued determination.

Moreover, the clock phase acquisition/tracking device according to the present invention is used for acquiring or tracking the phase of a clock for the quantization of input signal from the signal to which the quantization is made, comprising a phase error operation section for operating phase error to a given quantization timing of the quantized signal, and a clock generation section for generating the clock at the given phase based on the phase error information operated in the phase error operation section, wherein the phase error operation section comprises a determination unit for receiving the quantized signal and for determining whether the signal sample value is bigger or smaller than the threshold, an operation unit for operating the phase error using the determination results in the determination section and the signal sample value and for outputting the operation result to the clock generation section and, further, a threshold setting unit for setting the sample value of previously input signal upon the phase clock acquisition and for setting a value enabling the three-valued determination upon the phase clock tracking.

The clock phase acquisition device of the present invention mentioned above may be composed to perform the clock phase tracking from the signal obtained as the result of the desired signal processing after the quantization upon the completion of the acquisition and, in this case, the desired signal processing after the quantization can be the equalization.

It may also comprise a maximum likelihood detector for detecting the maximum likelihood of the equalized signal so that the phase error operation section may operate the phase error using the detection result from the maximum likelihood detector and the signal sample value upon performing the clock phase tracking.

Moreover, the clock phase acquisition device of the present invention mentioned above may be composed to quantize the input signal by an analog/digital converter for converting analog signal into digital signal and a digital/analog converter for converting digital signal into analog signal as for the phase error information from the phase error operation section may be disposed at the upstream stage of the clock signal generation section.

In this case, a limiter circuit for limiting the maximum value of phase error information from the phase error operation section may be disposed at the upstream stage of the digital/analog converter.

A bits number limitation section for limiting the bits number of the phase error information from the phase error operation section and a phase error information selection section for outputting selectively the phase error information of which the bits number is limited by the bits number limitation section upon the phase acquisition and for outputting selectively the phase error information from the phase error operation section upon the phase tracking can be disposed at the upstream stage of the digital/analog converter.

The bits number limitation section for limiting the bits number of the phase error information from the phase error operation section, a limiter circuit for limiting the maximum value of phase error information from the phase error operation section, and a phase error information selection section for outputting selectively the phase error information from the bits number limitation section upon the phase acquisition and for outputting selectively the phase error information from the limiter circuit upon the phase tracking may be disposed at the upstream stage of the digital/analog converter.

Figure 3:
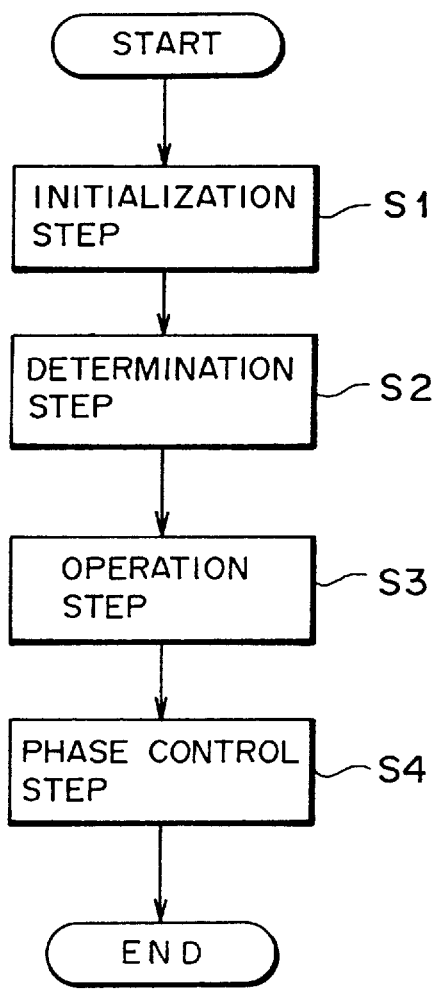
FIG. 3 is an illustration showing an aspect of the invention.

Now, FIG. 3 is a descriptive diagram showing an aspect of the present invention. This FIG. 3 shows the phase acquisition method for acquiring the clock phase for the quantization of the input signal from the quantized signal.

The phase acquisition method shown in FIG. 3 comprises the steps of determining whether a sample value of a signal quantized based on a clock signal is larger than a threshold of the sample value of a previous signal previous to the sample value of said signal (S1), operating the phase error between the sample phase of the signal and a given phase using the determination result of the determining step (S1) and the sample value of the input signal (S2), controlling the phase of the clock signal (S3) based on the phase error information operated in the operating step (S2) (S3), and initializing the threshold according to the sample value of the quantized signal when the determination is initiated in the determining step (S1) (S4).

(b) Description of a magnetic disk drive to which the clock phase acquisition/tracking device according to this embodiment is applied Now, the embodiment of the present invention will be described referring to the drawings.

Figure 4:
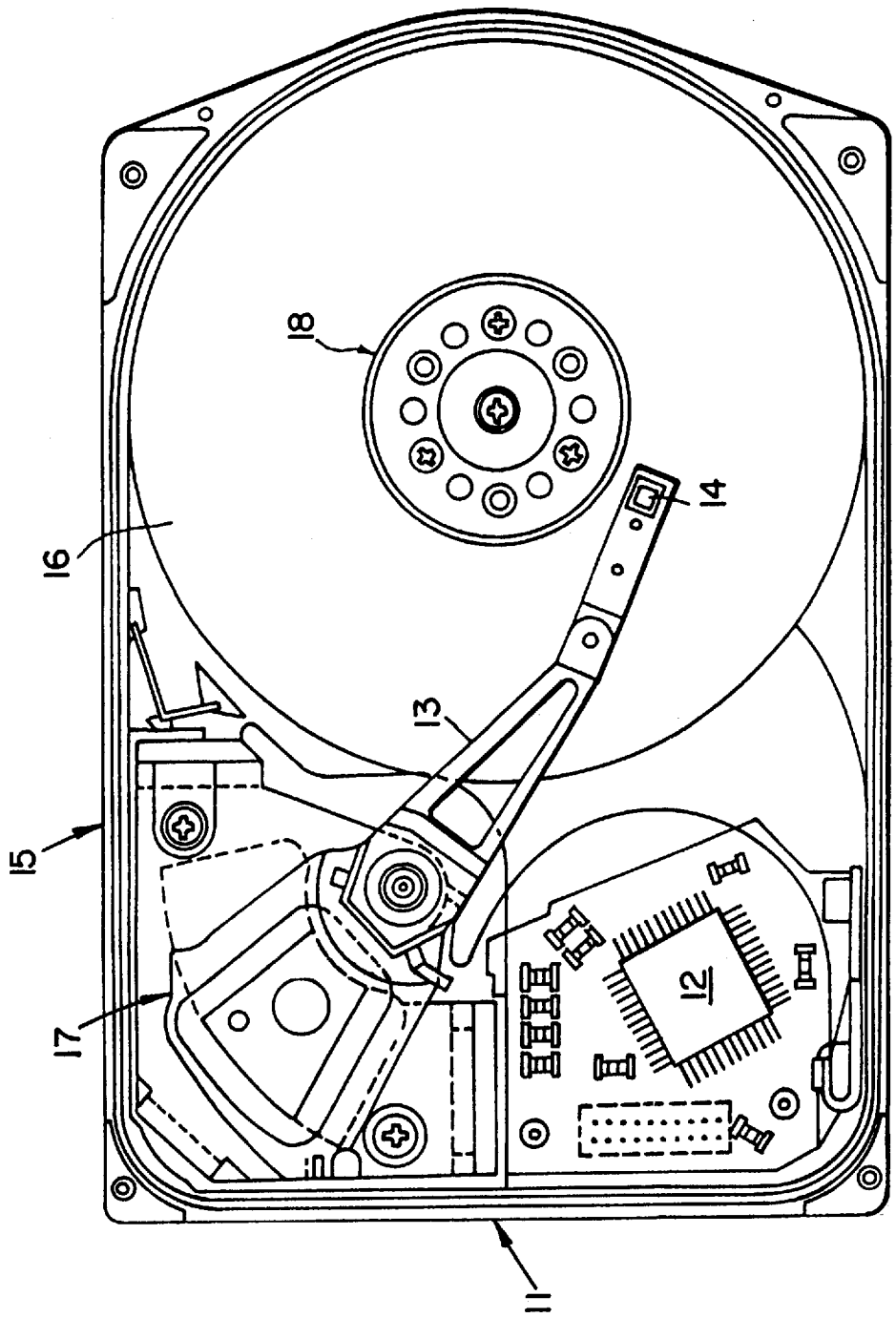
FIG. 4 is a diagram showing the structure of a magnetic disk drive to which a clock phase acquisition/tracking device according to this embodiment is to be applied.
Figure 5:
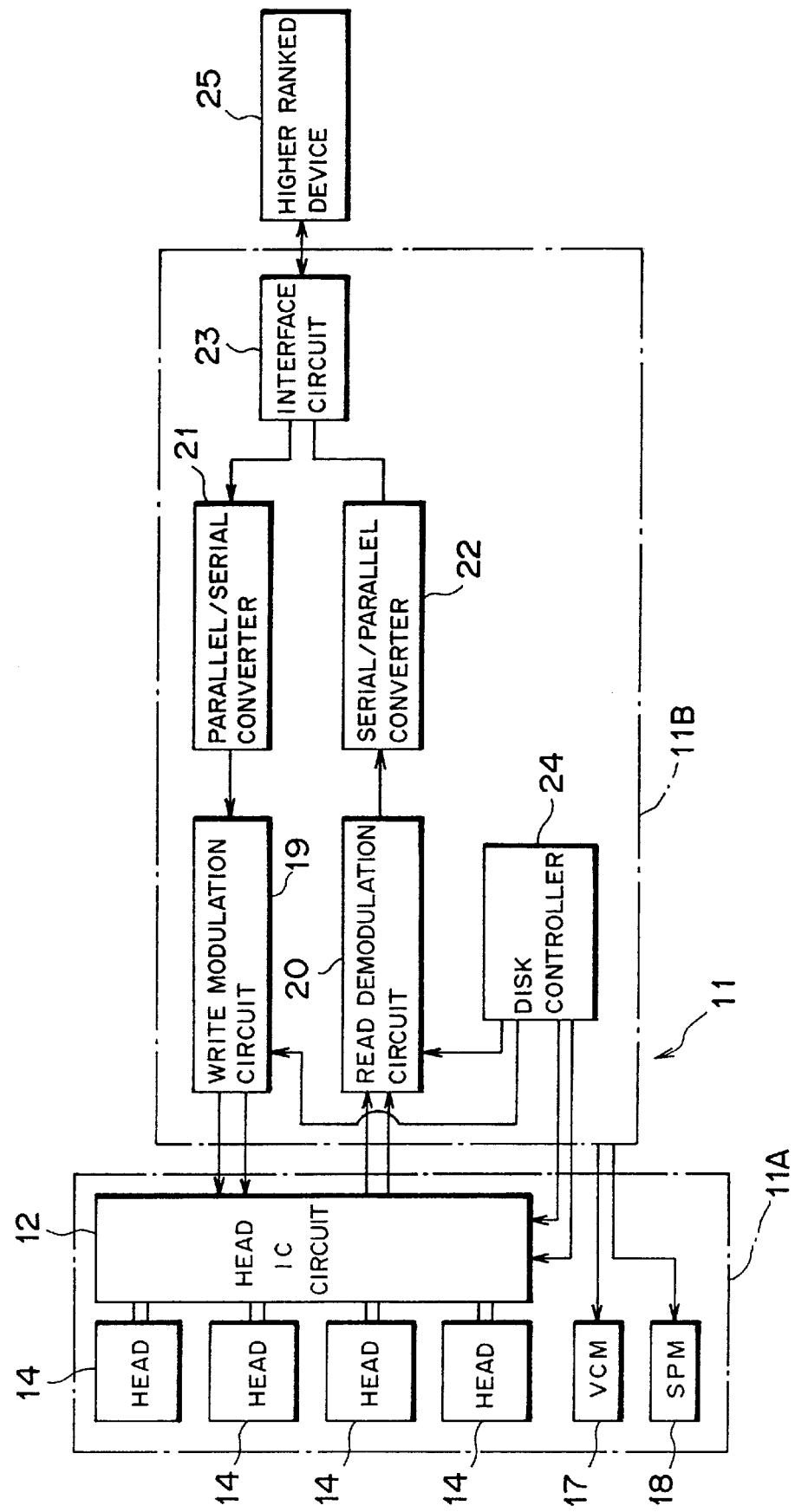
FIG. 5 is a block diagram showing the magnetic disk drive to which a clock phase acquisition/tracking device according to this embodiment is to be applied in respect of data signal read/write function.

FIG. 4 is a diagram showing the structure of a magnetic disk drive to which the clock phase acquisition/tracking device according to this embodiment is applied, while FIG. 5 is a block diagram showing the magnetic disk drive to which the clock phase acquisition/tracking device according to this embodiment is applied in respect of data signal read/write function.

The clock phase acquisition/tracking device according to this embodiment can be applied to a read demodulation circuit 24 as a data read section of a magnetic disk drive 11 to which PRML is applied as shown, for example, in FIG. 4 and FIG. 5.

To be more specific, the read demodulation section 24 extracts the clock phase for the quantization of readout signal by acquiring or tracking from the quantized signal.

Here, the magnetic disk drive 11 shown in this FIG. 4 comprises a disk enclosure 11A and a disk signal processing section 11B.

In the disk enclosure 11A, a head IC circuit 12 mounted on a flexible printed board is disposed.

Figure 24:
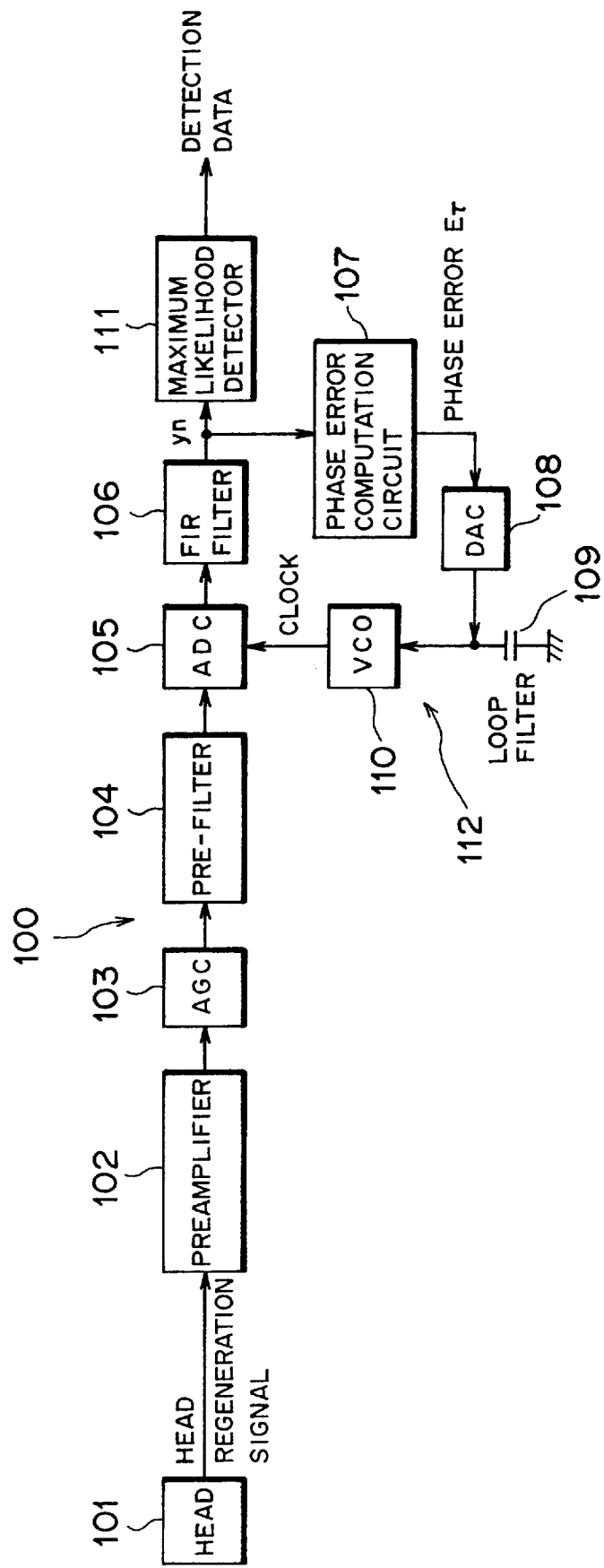
FIG. 24 is a diagram for illustrating a composition of data read section of a magnetic disk drive applying PRML.
Figure 25:
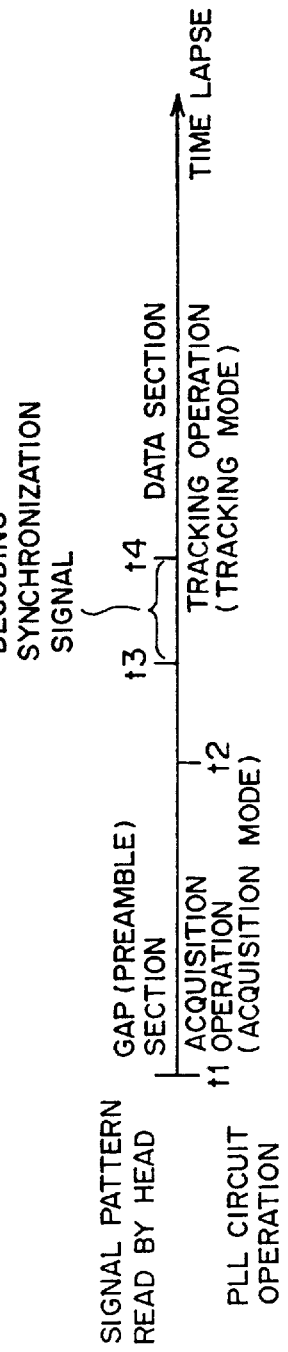
FIG. 25 is a diagram for illustrating data read operation by a magnetic disk drive.

Numeral 14 indicates a head and this head 14 corresponding to the reference 101 in the FIG. 24 reads as an analog electric signal the data recorded as magnetic variation on a magnetic disk 16 to transmit to the head IC circuit 12.

The disk enclosure 11A comprises a voice coil motor (VCM) 17 for driving a head actuator 13 under the indication of a disk signal processing section 11B and a spindle motor 18 for rotating the magnetic disk 16.

On the other hand, the disk signal processing section 11B comprises a write modulation circuit 19, a read demodulation circuit 20, a parallel/serial converter 21, a serial/parallel converter 22, a interface circuit 23 and a disk controller 24.

In general, the disk controller for controlling the entire device and the sequencer for the fine control upon record and regeneration are different from each other but they will be called "disk controller" collectively hereinafter.

Here, the interface circuit 23 performs the interface processing of read/write data to be exchanged with a higher ranked device 25 containing the magnetic disk drive 11, while the parallel/serial converter 21 converts parallel signal of write data from the interface circuit 23 into serial data.

The write modulation circuit 19 modulates parallel write data from the parallel/serial converter 21 through RLL (Run Length Limited) coding and outputs modulated write data to the head IC circuit 12 thereby the write data can be recorded onto the magnetic disk 16 through the head 14.

The read demodulation circuit 20 composes the data read section in the magnetic disk drive 11, and demodulates the read data input through the head 14 and the head IC circuit 12 by the PRML system. The read demodulation circuit 20 basically has substantially the same composition as the data read section (refer to the reference 100) shown in FIG. 24 mentioned before except for the clock phase acquisition/tracking device (PLL circuit; refer to the reference 112).

As the other parts than the PLL section 112 in the data read section 100 composing the read demodulation circuit 20 are basically similar, the detailed description thereof will be omitted.

The serial/parallel converter 22 converts serial data of the read data demodulated by the read demodulation circuit 20 into parallel data and outputs the converted read data to the higher ranked device 25 through the interface circuit 23.

The disk controller 24 controls the write modulation circuit 19, the read demodulation circuit 20 and the head IC circuit 12. More particularly, the disk controller 24 monitors the synchronization state of the clock phase for A/D conversion in an A/D converter 105 (refer to FIG. 24) as the quantization section in the read demodulation circuit 20 and performs the acquisition control or the tracking control based on the synchronization state.

Through the composition mentioned above, in the magnetic disk drive 11 shown in FIG. 4 and FIG. 5, when the data stored in the magnetic disk 16 for example is read out, the head IC circuit 12 receives the control signal from the disk controller 24 to select a desired head 14, and under the indication from the disk signal processing section 11B, the VCM 17 drives the head actuator 13 to shift the head 14 to the desired head position for outputting the read signal as an electric signal.

The read signal read out by the head 14 is demodulated by the PRML system in the read demodulation circuit 20 (refer to the signal processing of FIG. 24) to be converted into a serial signal and thereafter output to the higher rank device 25 through the interface circuit 23.

Similarly, when the data from the higher rank device 25 is written in the magnetic disk 16, the write date input through the interface circuit 23 is converted into parallel signal and thereafter modulated by the write modulation circuit 19. By this process, the modulated write signal is recorded at the desired position on the magnetic disk 16 through the head IC circuit 12 and the head 14.

(c1) Description of a First Embodiment

Figure 6:
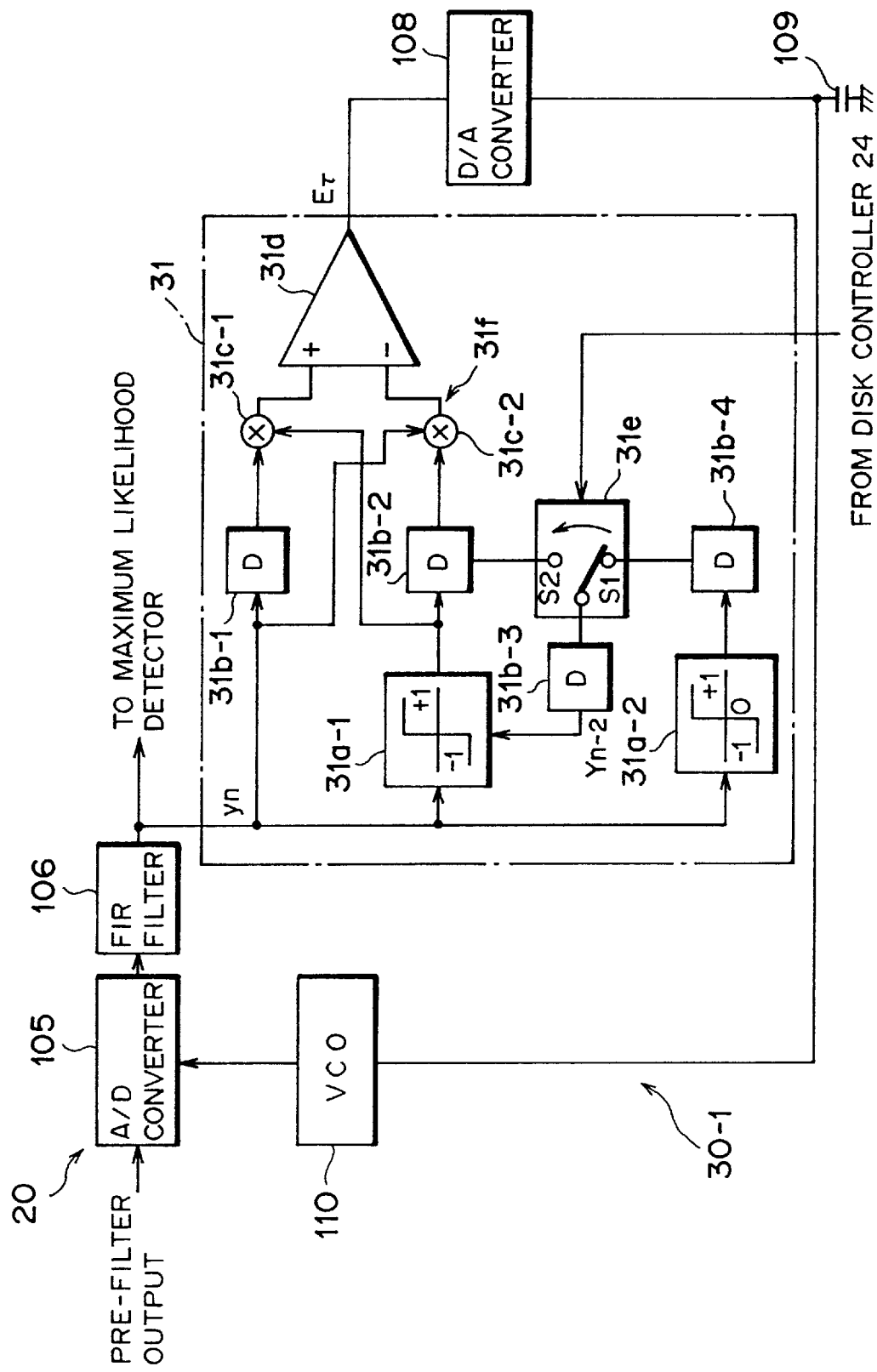
FIG. 6 is a block diagram showing a clock phase acquisition/tracking device according to a first embodiment of the invention.

FIG. 6 is a block diagram showing a clock phase acquisition/tracking device according to a first embodiment of the invention. The clock phase acquisition/tracking device 30-1 shown in this FIG. 6 can be applied to the read demodulation circuit 20 of the magnetic disk drive 11 mentioned above.

Namely, the clock phase acquisition/tracking device 30-1 shown in this FIG. 6 functions as the PLL circuit 112 of the data read section 100 shown in FIG. 24 mentioned above to acquire or track from the quantized signal the clock phase for the quantization in the A/D converter 105.

Here, the clock phase acquisition/tracking device 30-1 comprises a D/A converter 108, a loop filter 109 and a VCO 110 similar to the PLL circuit 112 mentioned above and a phase error operation section 31.

The phase error operation section 31 is designed to operate the phase error $E_\tau$ to a given quantization timing of the signal quantized by the A/D converter 105, while the D/A converter 108 converts the phase error $E_\tau$ (digital signal) operated by the phase error operation section 31 into an analog signal.

Thus, in the analog signal containing the phase error $E_\tau$ converted by the D/A converter 108, the only phase error information is extracted by the filter loop 109 and output to the VCO 110.

The VCO 110, as a clock generation section, generates a clock at a given phase based on the phase error information $E_\tau$ operated in the phase error operation section 31 mentioned below. Based on the clock generated by this VCO 110, the A/D conversion may be performed by the A/D converter 105 as a quantization section.

As mentioned before, the clock phase acquisition indicates a state wherein a system acts so that the phase error $E_\tau$ computed in the phase error operation section 31 may be around 0 when this phase error $E_\tau$ is unstable around 0, while the clock tracking indicates a state wherein a system acts so that the phase error $E_\tau$ computed in the phase error operation section 31 is stable around 0 and the phase error $E_\tau$ remains around 0 thereafter.

The phase error operation section 31 comprises two decision circuit 31*a*-1, 31*a*-2, an operation section 31*f* and a switch 31*e*.

Here, the decision circuit 31*a*-1 as a determination section is a hysteresis type decision circuit for receiving signal ($y_n$; digital signal) quantized and equalized by the A/D converter 105 and the FIR filter 106, and for performing the binary determination (+1 or −1) of its signal level (sample value) taking the previous (2 bits before) determination value $Y_{n-2}$ as threshold and outputs the determination result as $Y_n$.

Then, the decision circuit 31*a*-2 compares the equalized signal $y_n$ with "0", given threshold, to output "1" as determination value when it is bigger than this threshold and "−1" when it is smaller than the threshold.

Consequently, this decision circuit 31*a*-2 functions as a sign determination section for determining whether the sample value of the quantized signal is bigger or smaller than the given sign determination reference value (in this case, "0" as a value permitting the determination of positive or negative sign).

The delay element (D) 31*b*-4 outputs to the switch 31*e* a signal $Y_{n-1}$ previous by 1 bit when the determination value $Y_n$ from the decision circuit 31*a*-2 is input.

The operation section 31*f* functions as an operation section for operating the phase error $E_\tau$ using the determination result from either of the decision circuit 31*a*-1 or the decision circuit 31*a*-2 and the signal sample value from the FIR filter 106, and for outputting the operation result to the VCO 110 through the D/A converter 108 and the loop filter 109.

To be specific, the operation section 31*f* comprises, more particularly, delay elements (D) 31*b*-1, 31*b*-2 for delaying the input signal by 1 bit and outputting it, multipliers 31*c*-1, 31*c*-2 and a subtracter 31*d*, and operates the phase error $E_\tau$ as shown in the expression (1) above-mentioned.

The switch 31*e* is designed to select a threshold in the decision circuit 31*a*-1 by switching any one of the way S1 from the delay element 31*b*-4 or the way S2 from the delay element 31*b*-2 based on the control signal from the disk controller 24.

More particularly, the switch 31*e* switches to select as the threshold the previous determination result in the decision circuit 31*a*-2 (way S1) upon the beginning of clock phase acquisition and to perform feeding back of previous determination result in the decision circuit 31*a*-1 (way S2) when the clock phase is acquired and to select it as the threshold.

The delay element (D) 31*b*-3 is designed to deliver to the decision circuit 31*a* the determination value $y_{n-2}$ previous by 1 bit to the determination value $Y_{n-1}$ when the determination value $Y_{n-1}$ selected by the switch 31*e* is input.

Consequently, when the way S1 is selected by the switch 31*e*, the determination value $Y_{n-2}$ previous by two bits in the decision circuit 31*a*-2 may be taken as the threshold of the decision circuit 31*a*-1, and when the way S2 is selected, the determination value previous by two bits in the decision circuit 31*a*-1 may be taken as the threshold of the decision circuit 31*a*-1.

In other words, upon the beginning of the phase clock acquisition, when the phase error $E_\tau$ is operated in the phase error operation section 31, the decision circuit 31*a*-1 determines using the threshold set based on the signal quantized previously, concerning the signal quantized by the A/D converter 105.

The threshold upon the beginning of clock phase acquisition can be set by the disk controller 24 and the switch 31*e*. Consequently, upon the beginning of clock phase acquisition, these function sections function as threshold setting section for setting the threshold value to be used for the determination in the decision circuit 31*a*-1, based on the quantized signal.

When the clock phase is acquired, the disk controller 24 and the switch 31*e* set as a threshold the determination result of the sample value $y_{n-1}$ of the quantized signal input previous to the sample value $y_n$ of the input quantized signal.

Thus, upon the beginning of the phase clock acquisition, the switch 31*e* sets as a threshold in the decision circuit 31*a*-1 the determination result from the decision circuit 31*a*-2, and when the clock phase is acquired, the switch 31*e* sets as a threshold in the decision circuit 31*a*-1 the determination result of the sample value of the signal input previous to the sample value of the quantized signal so as to function as a switch section.

The clock phase acquisition/tracking device 30-1 shown in FIG. 6 may comprise a circuit section for phase tracking (not shown).

Through this composition, the clock phase acquisition/tracking device 30-1 according to the first embodiment of this invention operates as follows.

Namely, the clock phase acquisition or tracking for the A/D conversion (quantization) in the A/D converter 105 is performed using the quantized signal $y_n$ (equalized signal) input from the FIR filter 106 based on the control from the disk controller 24.

Here, upon beginning the clock phase acquisition in the clock phase acquisition/tracking device 30-1, the initialization is made by taking as a determination value from the decision circuit 31*a*-2 about a sample value of the quantized signal the threshold for the determination in the decision circuit 31a-1 of the phase error operation section 31.

In other words, at the initialization, the switch 31e is switched to select the determination value from the decision circuit 31a-2 at least during 2 bits period. Thus, in the decision circuit 31a-1, the determination is executed taking the determination value from the decision circuit 31a-2 as a threshold and the operation section 31f operates the phase error $E_\tau$ using the determination value in the decision circuit 31a-1 and the quantized signal to be input to output it.

Here, the 2-bit cycle above-mentioned indicates the cycle wherein the determination result from the decision circuit 31a-2 is input into the decision circuit 31a-1 through two delay elements 31b-4 and 31b-3.

When the phase is acquired after the initialization, the decision circuit 31a-1 is acted as hysteresis type decision circuit to operate the phase error $E_\tau$.

Namely, when the phase acquisition operation is performed subsequent to the initialization above-mentioned, the phase error operation section 31 determines whether or not the sample value ($y_n$, $y_{n-1}$) of the quantized signal is larger than a threshold which is a sample value of a previous signal previous to the sample value of the above-mentioned signal, and operates the phase error $E_\tau$ between the given phase and the sample phase of the quantized signal $y_n$ using this determination results $Y_n$ and $Y_{n-1}$ and the sample values $y_n$ and $y_{n-1}$ of the quantized signal.

The operation result from the phase error operation section 31 is output to the VCO 110 through the D/A converter 108 and the loop filter 109, while the VCO 110 takes this phase error $E_\tau$ as a control information and controls the A/D converter 105 to generate a clock in the phase in which $E_\tau$ directs toward 0.

Figures 28A, 28B:
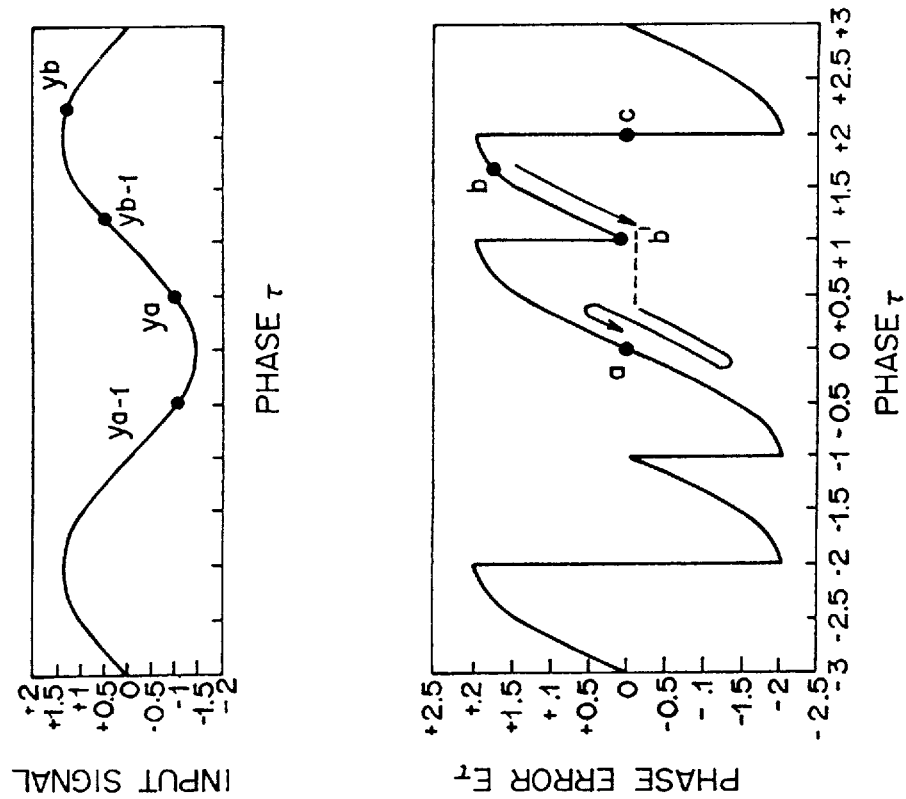
FIG. 28(a) and FIG. 28(b) both are diagrams for illustrating the clock phase acquisition operation by the data read section having the composition of essential parts shown in FIG. 26.

Thus, as shown in FIG. 7(a), when the sample value is at the position ($y_b$, $y_{b-1}$) and the phase $\tau$ and the phase error $E_\tau$ are at the value corresponding to the point b shown in FIG. 7(b), by performing a phase acquisition after the threshold initialization mentioned above, the point b approaches to the point c as a phase acquisition completion point instead of approaching the point a as shown in FIG. 28(b) mentioned above.

Figure 8:
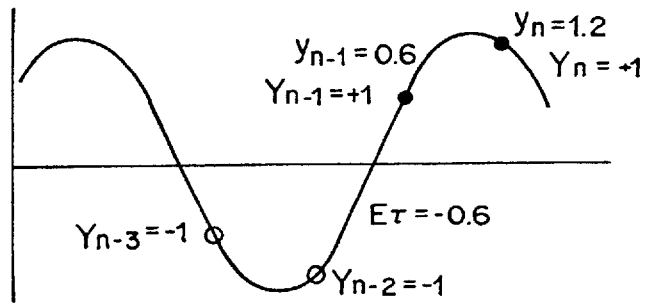
Figure 8:
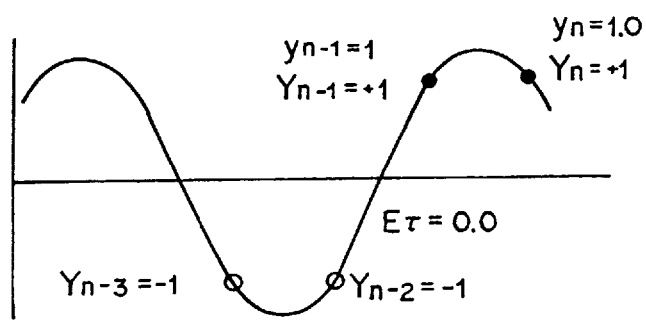
Figure 8:
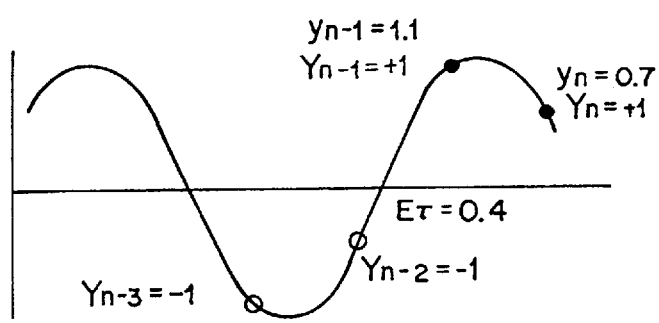
Figure 8:
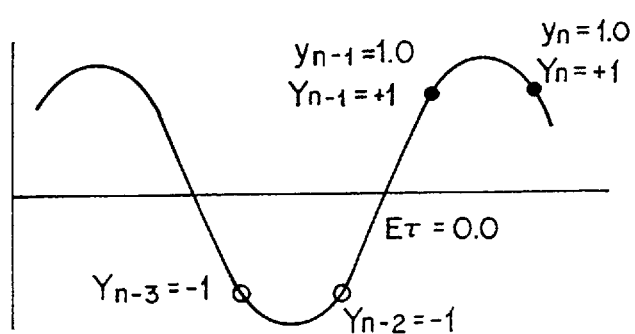

In other words, in the clock phase acquisition/tracking device 30-1, the phase acquisition is performed through the state transition on the time series as shown in FIG. 8(a) to FIG. 8(d) Namely, as shown in FIG. 8(a), as determination values $Y_{n-3}=-1$, $Y_{n-2}=-1$ by the real sample value is used as initial threshold, the initial phase error $E_\tau$ will be $E_\tau=-0.6$ of which absolute value is smaller than the same period in the phase error computation circuit 107 (refer to FIG. 27(a)).

This allows to decrease accumulated charge in capacitors composing the loop filter 109, to reduce the excessive phase error $E_\tau$ at the stage of FIG. 8(c) and to accelerate the phase acquisition.

Figure 9:
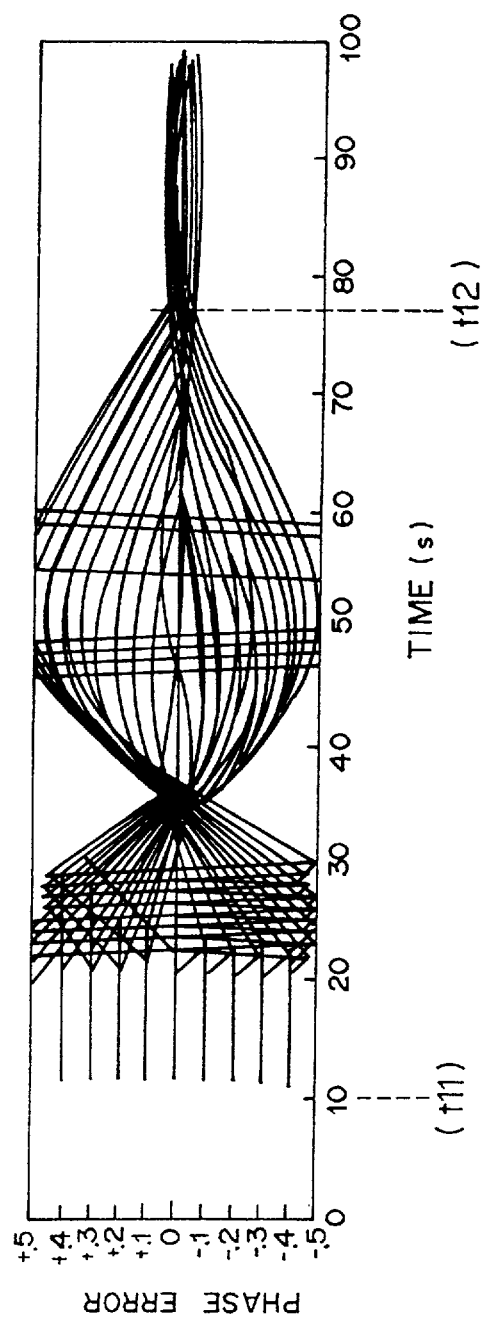
FIG. 9 and FIG. 10 both are diagrams for illustrating the effect of the first embodiment of the invention.
Figure 26:
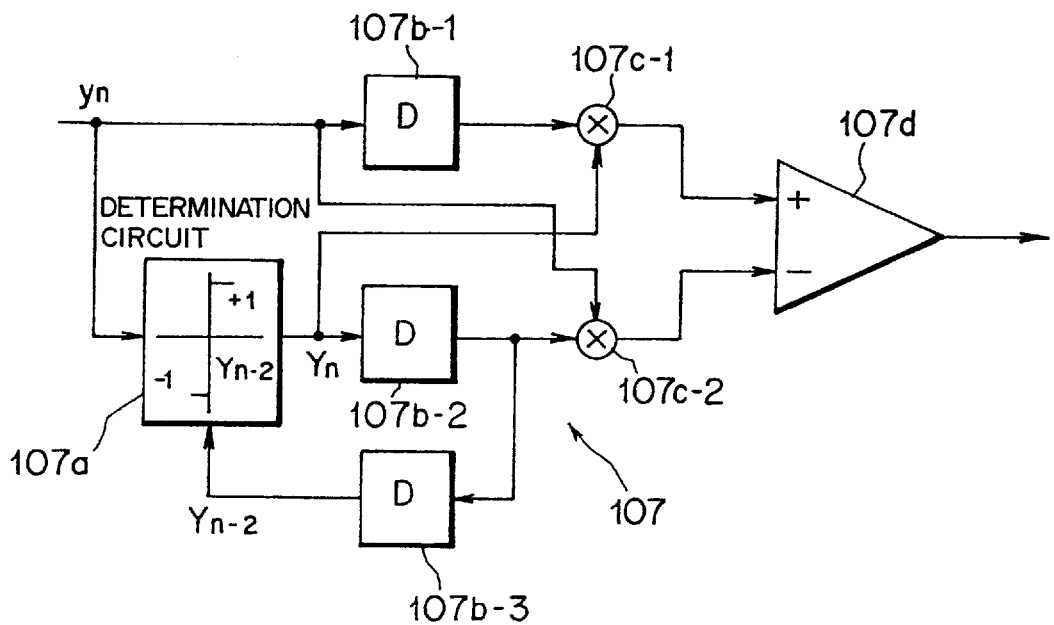
FIG. 26 is a diagram showing an example of the composition of essential parts of data read section of a magnetic disk drive to which PRML is applied.

Thus, when the phase error computation circuit 107 shown in FIG. 26 is used, time passing from the beginning of the phase acquisition (Time; abscissa) versus phase error (shift from the ideal phase) $E_\tau$ will be as shown in FIG. 9.

Here, if the phase shift should be converged within 10% as the condition of phase acquisition completion, the time represented by the time points (t11) to (t12) will be required for the phase acquisition as shown in FIG. 9.

Figure 10:
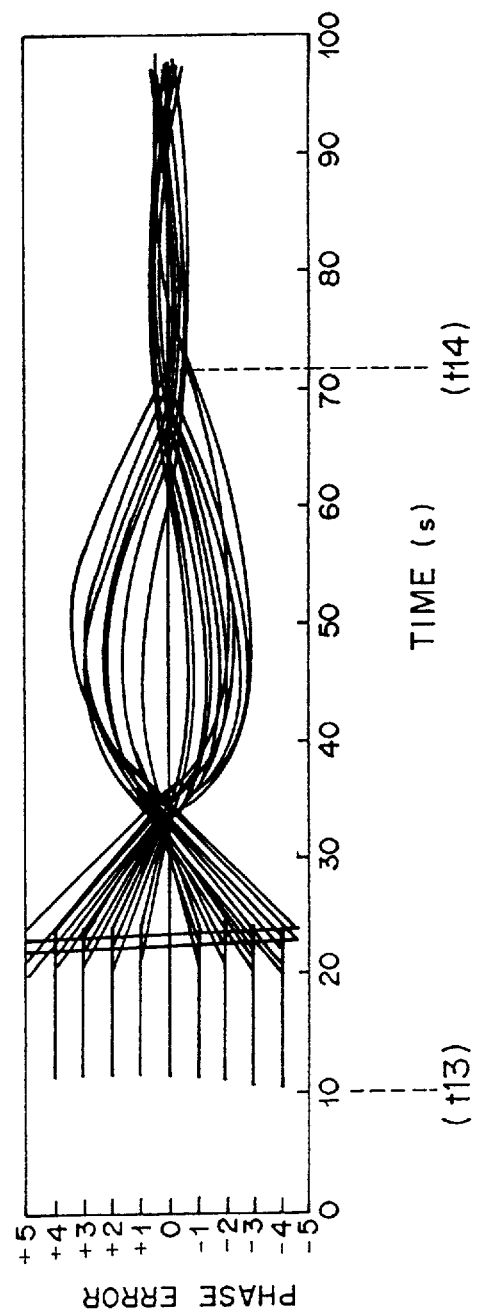

On the contrary, if the phase error operation circuit 31 shown in FIG. 6 is used, the time required for the phase acquisition will be represented by the time points (t13) to (t14) shown in FIG. 10; as the result, the phase acquisition will be completed earlier when the phase error operation circuit 31 is used than when the phase error computation circuit 107 is used (in the case shown by this FIG. 10, the time may be reduces by 10 bits or more than the case of FIG. 9).

Thus, in the clock phase acquisition/tracking device according to the first embodiment of the present invention, upon beginning the clock phase acquisition, when the phase error $E_\tau$ is operated in the phase error operation section 31, the determination about the quantized signal can be made using a threshold set based on the signal quantized previously, the time required for the phase acquisition may be reduced, so the device response performance can be improved.

More particularly, in the first embodiment, as the clock phase acquisition/tracking device 30-1 can be applied to the magnetic disk drive 11, the time necessary for the phase acquisition can be reduced, and the amount of information to be recorded in a gap section can also be reduced. The amount of unnecessary information other than data to be recorded on the magnetic disk can be reduced, so the format efficiency is improved and, as the result, the amount of information that can be recorded on a magnetic disk is advantageously increased.

(c2) Description of the first modification of the first embodiment

Figure 11:
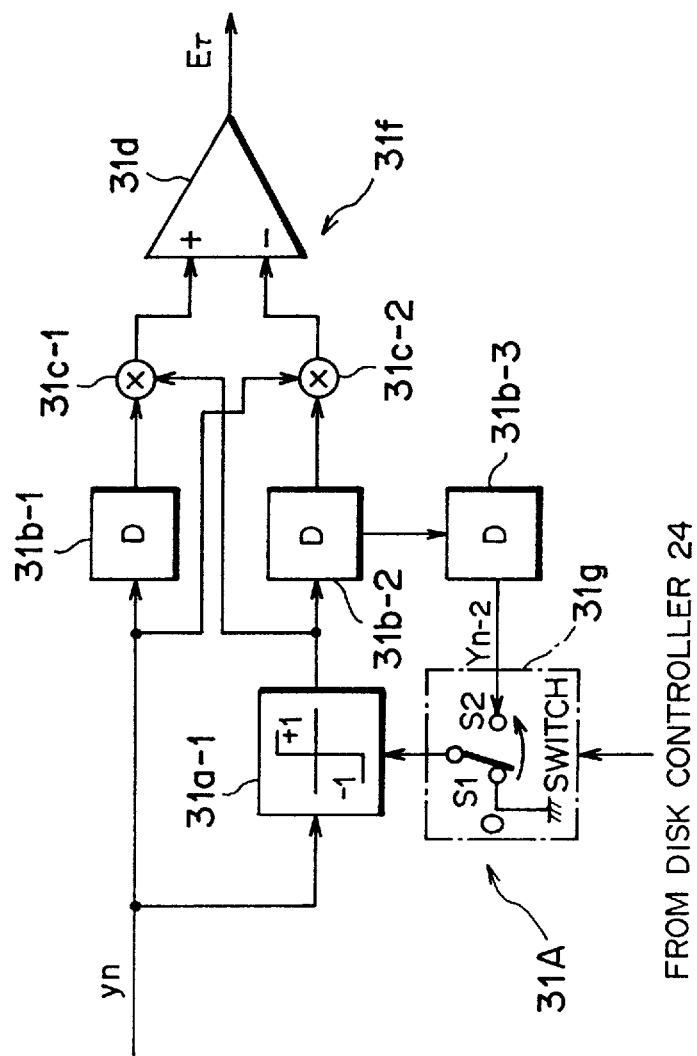
FIG. 11 is a block diagram showing a first modification of the first embodiment of the invention.

The phase error operation section 31 according to the first embodiment comprises the decision circuit 31a-2 for the initial setting upon phase acquisition but, without limiting to this, as the phase error operation section 31A shown in FIG. 11, the decision circuit 31a-1 as determination section can be made common as the decision circuit upon the initial setting.

For this purpose, in comparison with that according to the first embodiment, the phase error operation section 31A shown in FIG. 11 comprises a switch 31g without providing the decision circuit 31a-2, the delay element 31b-4 and the switch 31e, and otherwise it presents basically a similar composition. In FIG. 11, the same symbols as in FIG. 6 refer to same parts.

Here, under the control of the disk controller 24, the switch 31g sets a value for a sign determination about the sample value of the quantized signal (in this case also, "0" as the value for the positive/negative sign determination) in the decision circuit 31a-1 upon the beginning of clock phase acquisition and selects the sample value of a signal input previous to the sample value of the quantized signal above-mentioned when the phase is acquired for functioning as a switch section.

Consequently, in the first modification of the first embodiment also, upon the beginning of clock phase acquisition, when the operation of the phase error $E_\tau$ is performed in the phase error operation 31, the determination about the quantized signal can be made using a threshold set based on the signal quantized previously. Therefore, the first modification of the first embodiment can provide not only the same advantage as that according to the first embodiment but also another advantage of reduction of circuit scale because the provision of the switch 31g makes the disposition of a plurality of decision circuits unnecessary.

(c3) Description of the second modification of the first embodiment

Figure 12:
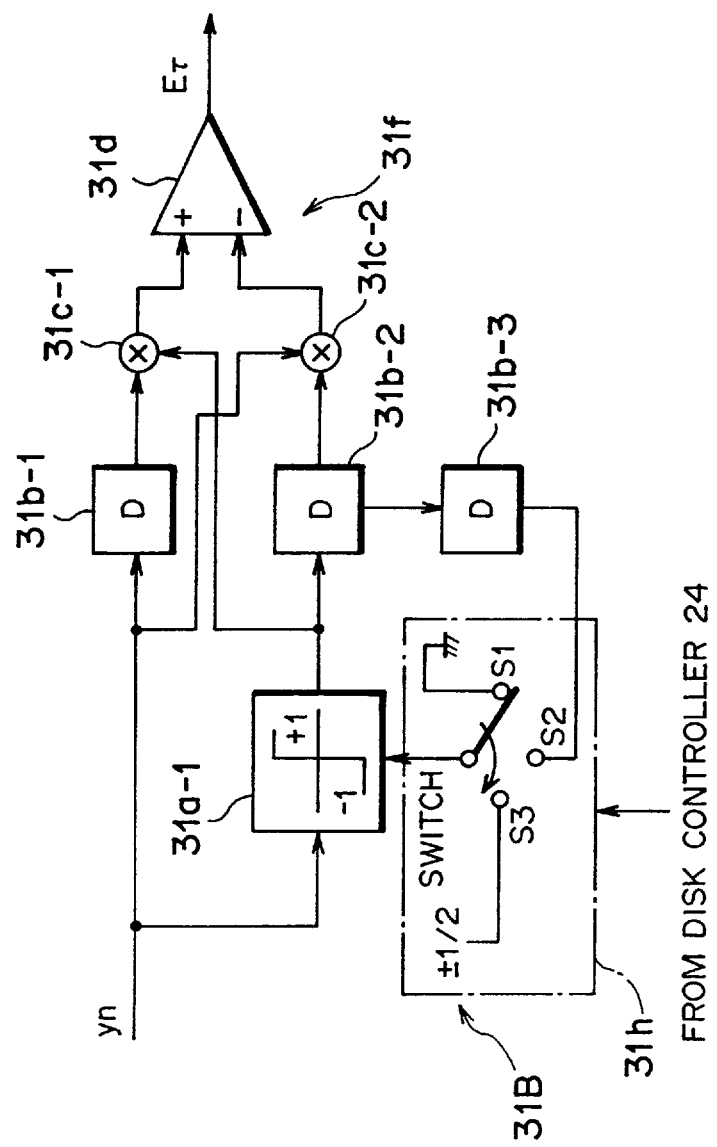
FIG. 12 is a block diagram showing a second modification of the first embodiment of the invention.

In the first modification of the first embodiment, the switch 31g switches the threshold of the decision circuit 31a-1 upon the beginning of the phase acquisition and the threshold of the decision circuit 31a-1 during the phase acquisition; however, without limiting to this, like the switch 31h of the phase error operation section 31B shown in FIG. 12, for example, it is possible to set by switching the threshold upon the phase tracking in addition to the each threshold described above.

Having the function of the switch 31g in the first modification of the first embodiment, the switch 31h sets by switching the threshold of the decision circuit 31a-1 to the threshold for clock phase tracking under the control of the disk controller 24 when the clock phase acquisition is completed.

Here, ±½ as a value capable of performing a three-valued determination may be set to the threshold for the clock phase tracking. In this case, the decision circuit 31a-1 determines as "−1" when the sample value $y_n$ of the input quantized signal is less than −½, as "0" when it is between −½ and +½ and as "1" when it is in the range bigger than +½.

Note that in FIG. 12, the same symbol as in FIG. 6 indicate same parts.

In consequence, the second modification of the first embodiment also presents not only the same advantages as the first embodiment and first modification of the first embodiment, but also other advantage of performing effectively the phase tracking by making the decision circuit for phase tracking also common with the circuit for phase acquisition, because the determination result of the three-valued determination can be used as the determination value to be used for the phase error operation for the phase tracking.

(c4) Description of the third modification of the first embodiment

Figure 13:
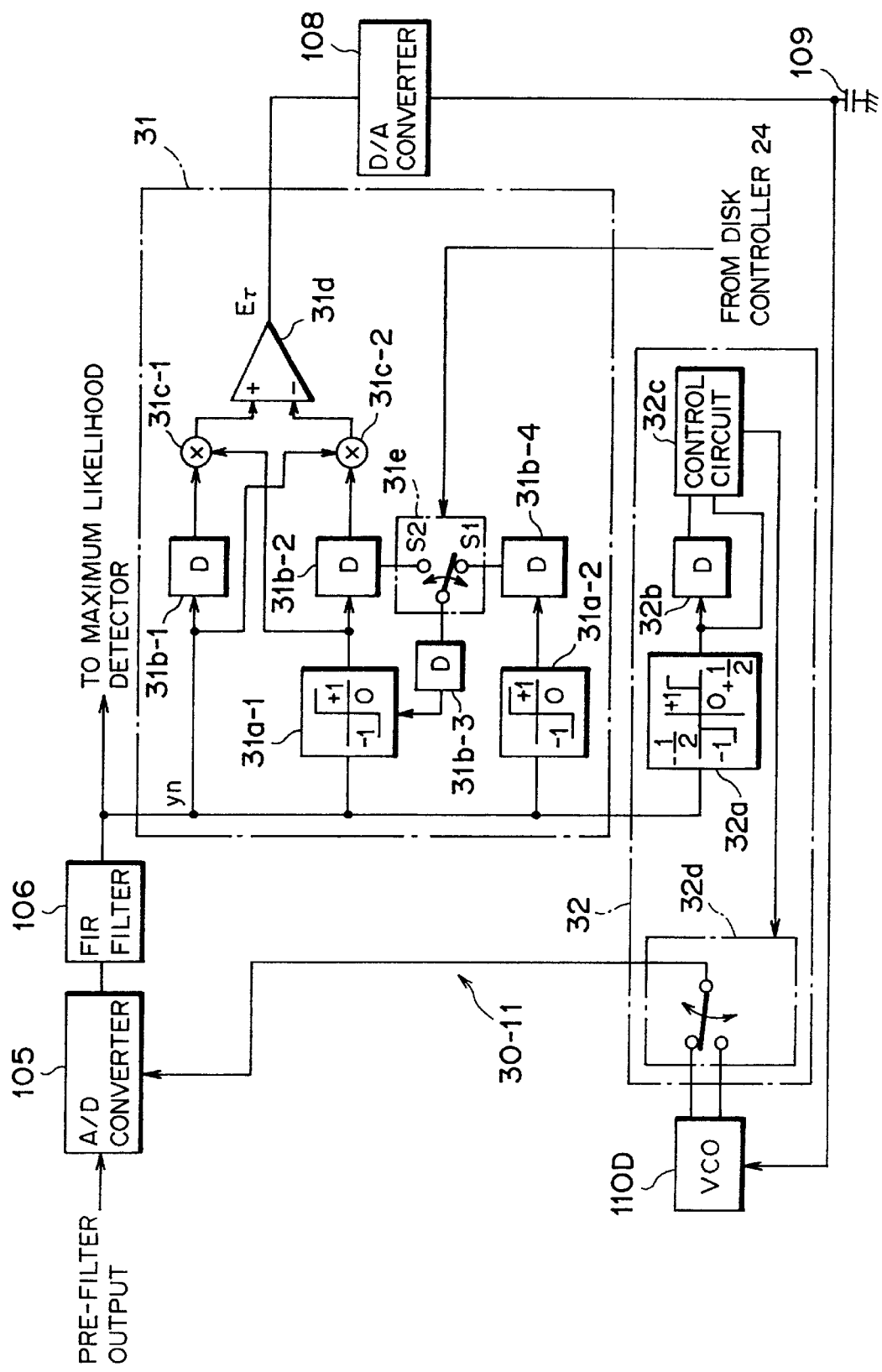
FIG. 13 is a block diagram showing a third modification of the first embodiment of the invention.

In the first embodiment and each modification of the first embodiment, the A/D conversion processing in the A/D converter 105 is performed based on a single phase clock generated by the VCO 110; however, as the clock phase acquisition/tracking device 30-11 shown in FIG. 13 for example, the VCO 110D may be composed to generate a plurality of clocks having different phases from each other and, also, the most appropriate clock for the A/D conversion processing in the A/D converter 105 among the plurality of clocks may be selected based on the level of quantized signal.

Compared to the clock phase acquisition/tracking device of the first embodiment above-mentioned, the clock phase acquisition/tracking device 30-11 shown in this FIG. 13 is different in that it comprise the VCO 110D above-mentioned and a clock selection section 32 but for other composition they are similar basically. Note that in FIG. 13, the same symbols as in FIG. 6 indicate same parts.

Here, the VCO 110D generates two clocks having antiphased relation to each other as a plurality of clocks having different phases than each other and either of these two clocks is selected by a switch 31k mentioned below and used for the A/D conversion processing by the A/D converter 105.

The clock selection section 32 outputs two clocks from the VCO 110D selectively to the A/D converter 105, based on the level of the signal quantized by the A/D converter 105, and comprises a decision circuit 32a, a delay element (D) 32b, a control circuit 32c and a switch 32d.

Here, the decision circuit 32a performs a three-valued determination about the quantized signal $y_n$ from the FIR filter 106; more particularly, the decision circuit 32a determines as "−1" when the sample value $y_n$ of the input quantized signal is less than −½, as "0" when it is between −½ and +½, and as "1" when it is in the range bigger than +½.

The delay element (D) 32b outputs a determination value from the decision circuit 32b to the control circuit 32c delaying by 1 bit. In consequence, the determination value $Y_n$ and the determination value $Y_{n-1}$ prior to the determination value $Y_n$ by 1 bit from the decision circuit 32a are input simultaneously into the control circuit 32c.

Upon the reception of the determination value $Y_n$ and the determination value $Y_{n-1}$ prior to the determination value $Y_n$ by 1 bit from the decision circuit 32a, the control circuit 32c outputs "0" as a control signal when the absolute value of the determination values ($Y_n$, $Y_{n-1}$) are (1, 1), and outputs "1" when the absolute value is (0, 1) or (1, 0) and may be comprised for example using an exclusive OR circuit (EXOR).

The switch 32d performs a switching operation based on a control signal from the control circuit 32c and outputs selectively either of two clocks from the VCO 110D to the A/D converter 105. To be specific, the switch 32d does not switch the switch when the control signal from the control circuit 32c is "0" and switches the switch when the control signal is "1".

In other words, the clock is not switched when the determination values input to the decision circuit 32c are the same as each other but it is switched to the clock having antiphased relation by linking the switch 32d to the opposite side to be output when the determination values are different each other as (0, 1) or (1, 0).

Through this composition, when the clock phase acquisition operation is performed, basically as first embodiment above-mentioned, the clock phase of the VCO 110D is controlled based on the phase error $E_\tau$ operated in the phase error operation section 31; however, when two determination values to be input into the decision circuit 32c of the clock selection section 32 are different each other, the clock to be delivered to the A/D converter 105 is inverted by the switching operation of the switch 32d.

Through this composition, particularly when the phase is shifted by 0.5 (180 degrees), as the clock can be inverted, the phase error $E_\tau$ can approach to 0 earlier than the case where the clock is not inverted.

Figure 14:
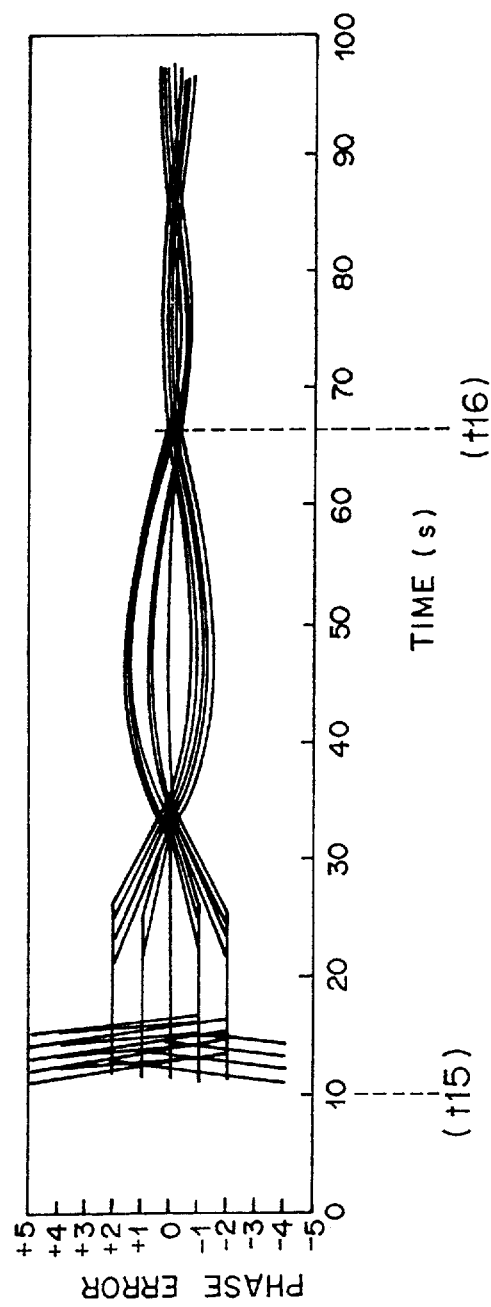
FIG. 14 is a diagram illustrating the effect of the third modification of the first embodiment of the invention.

Namely, by using the clock phase acquisition/tracking device 30-11 according to this modification, the time required for the phase acquisition will be remarkably shortened as represented by the time points (t15) to (t16) shown in FIG. 14.

Consequently, according to the third modification of the first embodiment, the provision of the VCO 110D for generating a plurality of clocks having different phases from each other and the clock selection section 32 enables to output to the A/D converter 105 selectively either of two clocks having antiphased relation to each other based on the level of the signal quantized by the A/D converter 105 so as to advantageously and remarkably shorten the time required for the phase acquisition.

In the third modification, the VCO 110D generates two clocks having antiphased relation to each other; however, without being limited to this, a plurality of clocks of different phase from each other at least may be generated and any one of these clocks may be selected by the clock selection section 32 to be output based on the level of the quantized signal and such composition also permits to expect a substantially same effect as that in the third modification.

(d) Description of the Second Embodiment

Figure 15:
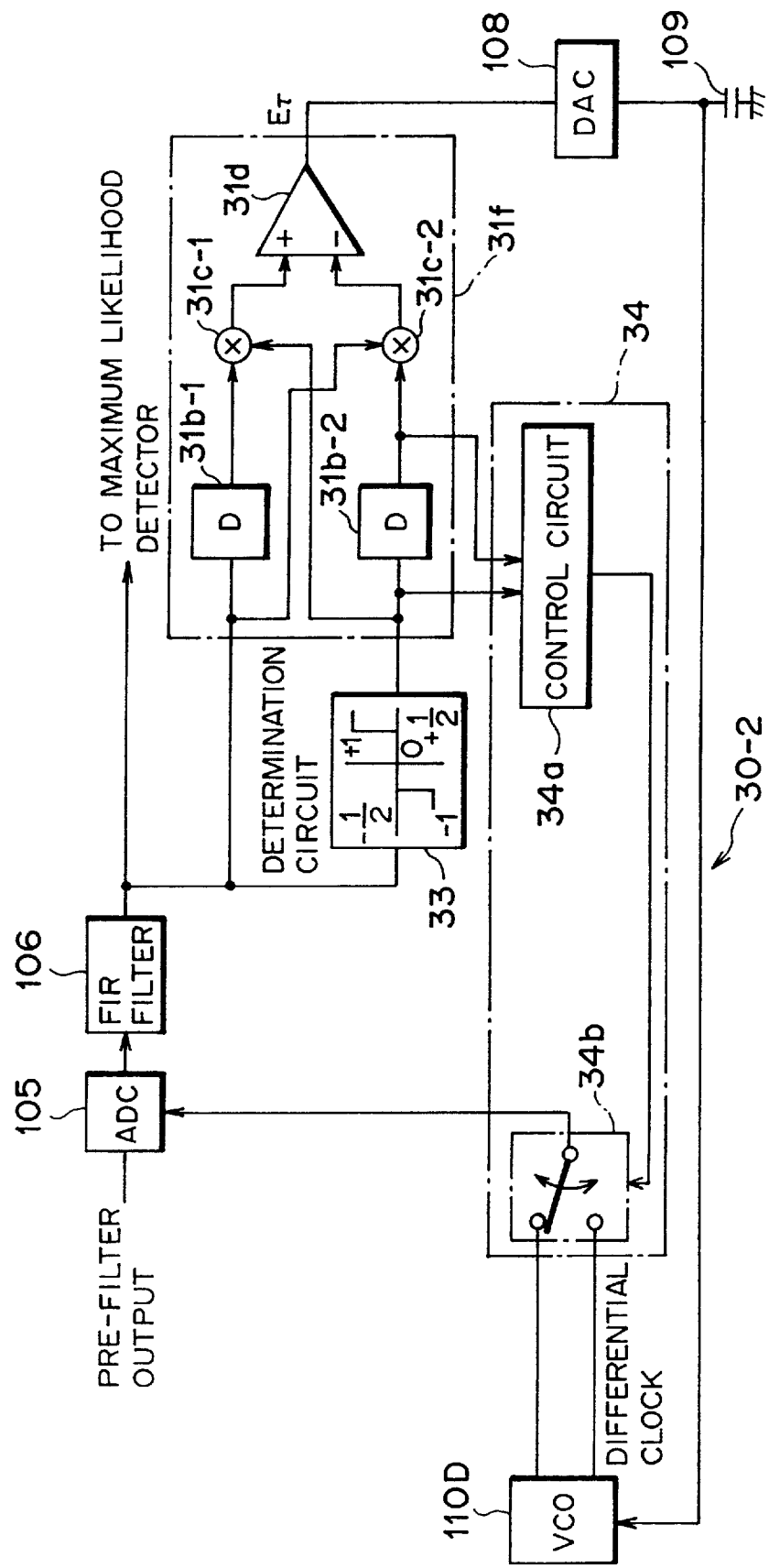
FIG. 15 is a block diagram showing a clock phase acquisition/tracking device according to a second embodiment of the invention.

FIG. 15 is a block diagram showing a clock phase acquisition/tracking device according to a second embodiment of the invention. The clock phase acquisition/tracking device 30-2 shown in FIG. 15 can also be applied to the read demodulation circuit 20 of the magnetic disk drive 11 shown in FIG. 5 just as that of the first embodiment.

Namely, the clock phase acquisition/tracking device 30-2 shown in FIG. 15 functions as the PLL circuit 112 of the data read section 100 of FIG. 24 mentioned above so as to acquire or track from the quantized signal the clock phase for the quantization by the A/D converter 105, in respect of output of the pre-filter 104 as input signal.

Here, the clock phase acquisition/tracking device 30-2 comprises a D/A converter 108 having the same function as that in the first embodiment above-mentioned, a loop filter 109, an operation section 31f, the VCO 110D, the decision circuit 33 and the clock decision section 34. Further, the same symbols as those in FIG. 6 indicate the same parts.

The VCO 110D generates two clocks having antiphased relation to each other as in the case of the third modification of the first embodiment above-mentioned and functions as clock generation section.

The decision circuit 33 receives the signal quantized by the clock from the VCO 110D (quantized signal) to perform a multi-valued determination by the given threshold for the sample value of this quantized signal, and functions as a determination section.

More particularly, the decision circuit 33 performs a three-valued determination by the given threshold±½ for the quantized signal $y_n$ to be input. To be more specific, the decision circuit 33 determines as "−1" when the sample value $y_n$ of the input quantized signal is less than −½, as "0" when it is between −½ and +½ and as "1" when it is in the range bigger than +½.

Further, the operation section 31f operates the phase error $E_\tau$ in respect of the given quantization timing of the quantized signal using the determination result in the decision circuit 33 and the sample value of the quantized signal, to output the phase error information as the phase control information to the VCO 110D and comprises delay elements 31b-1, 31b-2, multipliers 31c-1, 31c-2 and a subtracter 31d similar to the first embodiment above-mentioned.

The clock decision section 34 decides as the clock for the clock phase tracking either of two clocks from the VCO 110D based on the determination result from the decision circuit 33 when the clock phase acquisition is stabilized and comprises a control section 34a and a switch 34b.

Upon reception of the determination value $Y_n$ and the determination value $Y_{n-1}$ previous to the determination value $Y_n$ by 1 bit from the decision circuit 33 above-mentioned, the control circuit 34a outputs "0" as control signal when the absolute value of the determination value $(Y_n, Y_{n-1})$ is $(1, 1)$, and outputs "1" as control signal when the absolute value is $(0, 1)$ or $(1, 0)$, and can comprise for example by an exclusive OR circuit (EXOR).

The switch 34b performs a switching operation based on the control signal from the control circuit 32c, under control of the disk controller 24, for example, when the clock phase acquisition is stabilized, and delivers selectively either of two clocks from the VCO 110D to the A/D converter 105.

To be specific, the switch 34b does not switch when the control signal from the control circuit 33 is "0" and switches when the control signal is "1".

Through this composition, the clock phase acquisition/tracking device 30-2 according to the second embodiment of the present invention operates as follows.

Namely, the clock phase acquisition/tracking device 30-2 performs the clock phase acquisition or tracking for the A/D conversion processing (quantization processing) in the A/D converter 105 from the quantized signal $y_n$ (equalized signal) input from the FIR filter 106.

Here, when the clock phase acquisition processing is performed, the determination section 33 performs the three-valued determination by the given threshold (±½) for the quantized signal $y_n$. Using this determination value, the operation section 31f operates the phase error $E_\tau$ as in the case of the first embodiment.

Figure 16:
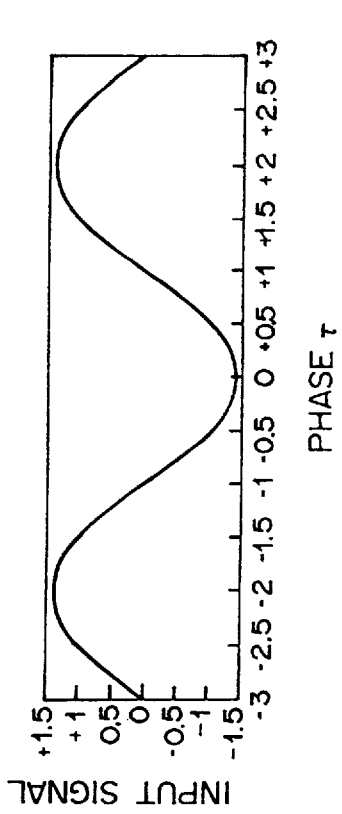
FIG. 16(a) and FIG. 16(b) are both diagrams for illustrating the operation of the second embodiment of the invention respectively.
Figure 16:
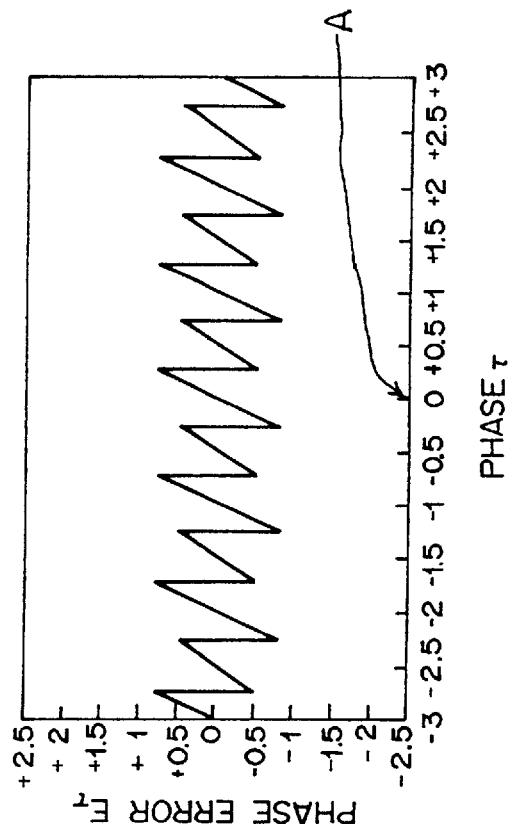

Using the clock phase acquisition/tracking device 30-2 according to the second embodiment, the phase error $E_\tau$ operated about the quantized signal of the input signal (pre-filter output) shown in FIG. 16(a) will be as shown in FIG. 16(b).

Namely, as shown in FIG. 16(b), even when the phase shift is not an integral, for instance shifted by 0.5, the phase error may become 0 sometimes. In consequence, if the VCO 110D is controlled operating the phase error $E_\tau$ through the three-valued determination, the phase error $E_\tau$ results in 0 even if the phase is shifted by 0.5 (position of which abscissa is shifted by +0.5 or −0.5 in FIG. 16(b)).

Through this composition, the phase acquisition operation can be completed by switching the clock phase generated by the VCO 110D based on the determination result from the decision circuit 33 when the phase error $E_\tau$ becomes 0 and the acquisition is stabilized in a state where the phase is shifted by an integral value or by 0.5 from the reference point A.

To be specific, when the absolute values of the determination values are $(1, 1)$ by the control circuit 34a, the clock phase selected at that time is used as it is without changing the clock selected by the switch 34b but, otherwise, namely in the case of $(0, 1)$ or $(1, 0)$, the clock having antiphased relation is used by linking the switch 34b to the opposite side.

This allows to complete the clock phase acquisition operation and to transit to a stable phase tracking operation thereafter.

Thus, in the second embodiment of the present invention also, the provision of the VCO 110D for generating two clocks having antiphased relation, the decision circuit 33 for performing the three-valued determination, the phase error operation section 31f for operating the phase error $E_\tau$ and, moreover, the clock decision section 34 for deciding as clock for performing the clock phase tracking either of two clocks generated by the VCO 110D based on the determination result from the determination section 33 when the clock phase acquisition is stabilized, the time required for the phase acquisition can be shortened, as in the first embodiment, so as to improve the response performance of the device.

More particularly, as the time required for the phase acquisition can be shortened by applying the clock phase acquisition/tracking device 30-2 according to the present invention to the magnetic disk drive 11, this allows the minimization of the information to be recorded in the gap section thereby reducing excessive information volume other than the data to be recorded on the magnetic disk so as to improve the format efficiency and, as a result, to increase advantageously the information volume to be recorded on a magnetic disk.

Moreover, only one three-valued decision circuit may sufficiently be used as the decision circuit for operating the phase error allowing to simplify the circuitry composition and to decrease the cost for composing the device.

(e) Description of the third embodiment

Figure 17:
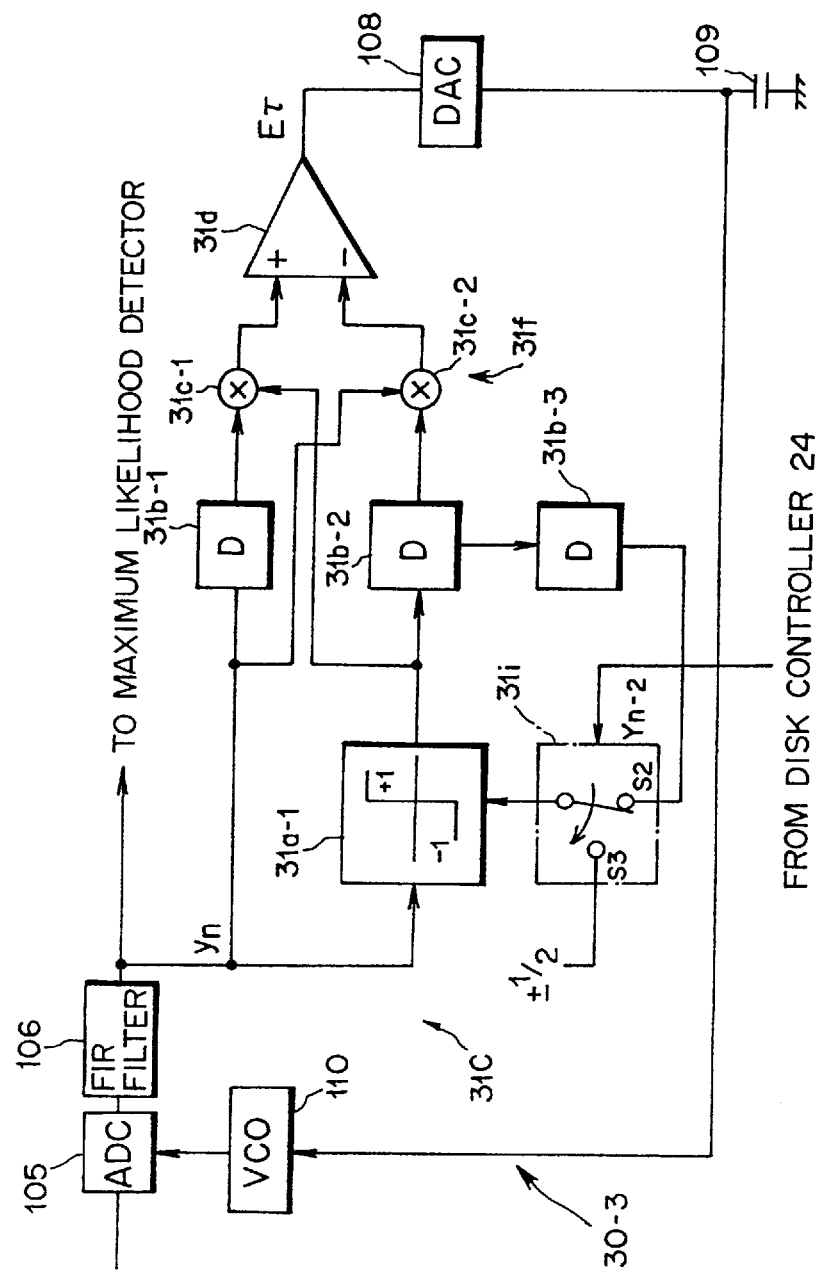
FIG. 17 is a block diagram showing a clock phase acquisition/tracking device according to a third embodiment of the invention.

FIG. 17 is a block diagram showing a clock phase acquisition/tracking device according to a third embodiment of the invention. The clock phase acquisition/tracking device 30-3 shown in FIG. 17 can also be applied to the read demodulation circuit 20 of the magnetic disk drive 11 shown in FIG. 5 as that in the first and second embodiments.

Namely, the clock phase acquisition/tracking device 30-3 shown in FIG. 17 functions as the PLL circuit 112 of the data read section 100 shown in FIG. 24 above-mentioned, and it is provided for acquiring or tracking from the quantized signal the clock phase for quantizing in the A/D converter 105 in respect of the output of the pre-filter 104 as an input signal. Note that, in FIG. 17, the same symbols as FIG. 6 indicate the same parts.

Here, the clock phase acquisition/tracking device 30-3 shown in FIG. 17 is composed to preset an arbitrary value as threshold to be used for the determination in the decision circuit 31a-1 and, to switch the threshold for the phase tracking.

For this purpose, the clock phase acquisition/tracking device 30-3 according to the third embodiment comprises a phase error operation section 31C and the VCO 110 and, moreover, a D/A converter 108 and a loop filter 109 having the similar function as those of respective embodiments mentioned above.

Here, the phase error operation section 31C operates a phase error to the given quantization timing of the quantized signal while the VCO 110 generates a clock for the A/D conversion in the A/D converter 105 at the given phase based on the phase error information $E_\tau$ operated in the phase error operation section 31C and has the function as a clock generation section.

Now, the phase error operation section 31C includes a decision circuit 31a-1, an operation section 31f, a delay element 31b-3 and a switch 31i.

The decision circuit 31a-1 receives a quantized signal $y_n$ from the FIR filter 106 and determines whether the sample value of this quantized signal $y_n$ is bigger or smaller than a threshold to be set by a switch 31i mentioned below to function as a determination section.

Furthermore, as in the case of the first embodiment, the operation section 31f operates the phase error $E_\tau$ using the determination result in the determination section 31a-1 and the sample value of the quantized signal $y_n$ to output the operation result to the VCO 110 through the D/A converter 108 and the loop filter 109, and comprises delay elements 31b-1, 31b-2, multipliers 31c-1, 31c-2 and a subtracter 31d.

Here, the delay element 31b-3 receives the determination value $Y_{n-1}$ (delayed by 1 bit) in the decision circuit 31a-1 from the delay element 31b-2 and delays it further by 1 bit. In consequence, the delay element 31b-3 outputs the determination value $Y_{n-2}$ delayed by 2 bits in the decision circuit 31a-1.

Moreover, the switch 31i switches a threshold to set the threshold to be used for the determination in the decision circuit 31a-1 under the control of the disk controller 24 and has the function as a threshold setting section.

To be more specific, as the threshold to be used for the determination in the decision circuit 31a-1, the switch 31i sets a sample value of a signal input previously by 2 bits from the delay element 31a-3 upon the clock phase acquisition while it sets a value enabling performance of the multi-valued determination upon the clock phase tracking.

By this, the decision circuit 31a-1 can be made common as the decision circuit for operating the phase error upon the clock phase acquisition and the clock phase tracking.

Further, as the multi-valued determination performed at the clock phase tracking, for example, three-valued determination can be performed similarly as in the case of the second modification of the first embodiment.

In this case, the threshold for performing the determination in the decision circuit 31a-1 can be set to ±½ for example, by the switch 31i.

By this composition, the clock phase acquisition/tracking device 30-3 according to the third embodiment of the invention operates as follows.

Namely, the clock phase acquisition/tracking device 30-3 performs the clock phase acquisition or tracking processing for the A/D conversion processing (quantization processing) in the A/D converter 105, from the quantized signal $Y_n$ (equalized signal) input from the FIR filter 106.

Here, for processing the clock phase acquisition abovementioned, a previous determination value of the decision circuit 31a-1 is set, by the switch 31i, as threshold for the determination in the decision circuit 31a-1 while, for processing the clock phase tracking, for instance, a value (±½) for performing the three-valued determination is set, by the switch 31i, as a threshold.

Thus, the clock phase acquisition/tracking device according to the third embodiment of the present invention allows to make common the decision circuit upon the phase acquisition and the phase tracking by the provision of the switch 31i, thereby contributing advantageously to the scale reduction of the device.

(f) Description of modification of each embodiment of the present invention

In the clock phase acquisition/tracking device according to the each embodiment, though the output signal from the FIR filter 106 is commonly used as a quantized signal for the operation of the phase error $E_\tau$ upon the both operations of clock phase acquisition and clock phase tracking, without being limited to this, for example, the output signal from the A/D converter 105 may also be used for the operation of the phase error $E_\tau$ upon the phase acquisition and, the output signal from the FIR filter 106 may be used for the operation of the phase error $E_\tau$ upon the phase tracking.

In other words, in the clock phase acquisition/tracking device according to the present invention, upon the completion of the phase acquisition, the clock phase tracking can be performed from the signal obtained as the result of the FIR filter processing (equalization processing) as the desired signal processing after the completion of the quantization.

Figure 18:
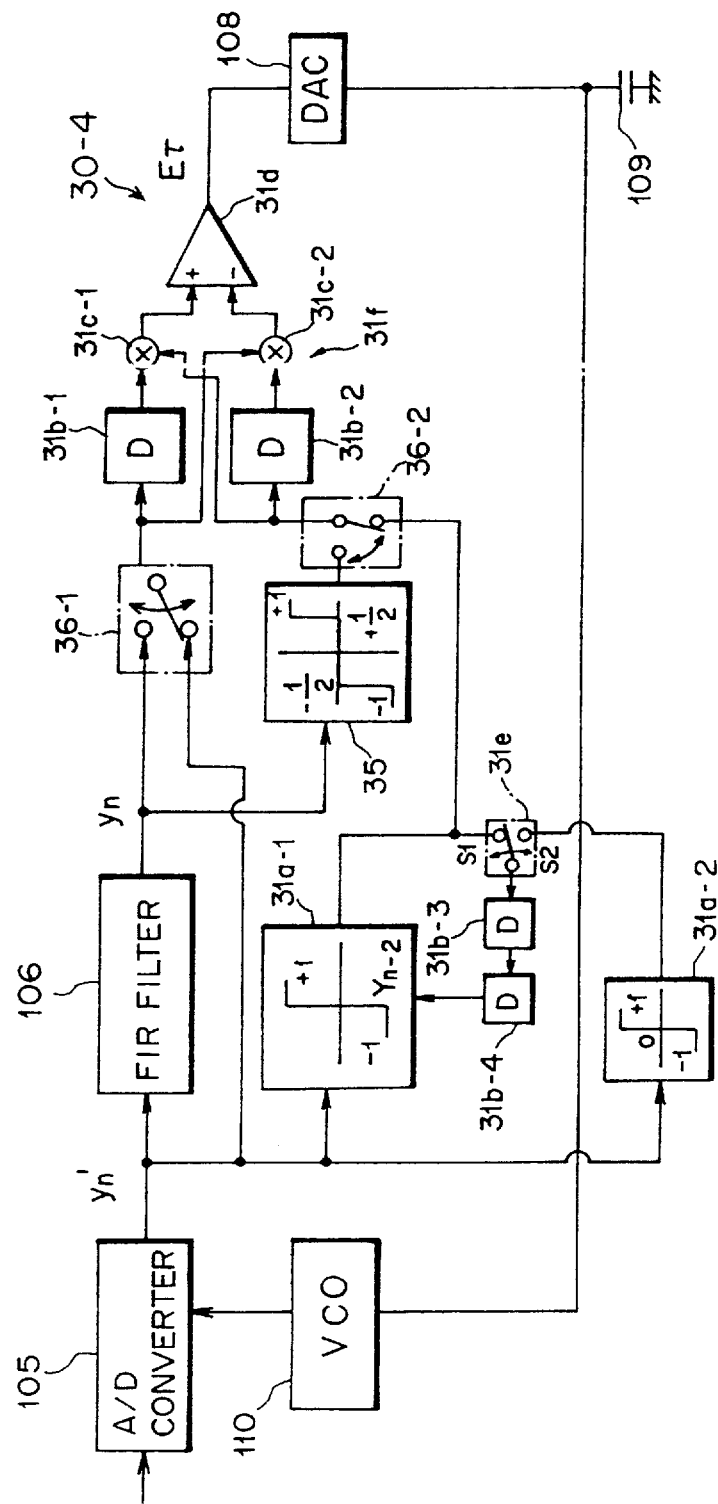
FIG. 18 and FIG. 19 both are block diagrams showing modification of the respective embodiments of the invention.

For instance, a clock phase acquisition/tracking device 30-4 as shown in FIG. 18 can be composed by applying the switching of quantized signal for the operation of the phase error $E_\tau$ upon the phase acquisition/tracking as mentioned above, to a circuit having the function of the clock phase acquisition/tracking device 30-1 according to the first embodiment.

Here, the clock phase acquisition/tracking device 30-4 shown in FIG. 18 comprises a decision circuit 31a-2, delay elements 31b-1, 31b-2 and a switch 31e having the functions substantially same as in the case of the first embodiment, and furthermore a decision circuit 35, switches 36-1 and 36-2. Further, in FIG. 18, the same symbols as in FIG. 6 indicate the similar parts.

Here, the decision circuit 31a-1 receives a signal ($y_n'$: digital signal) quantized by the A/D converter 105 and performs the binary determination of its signal level (sample value) taking a previous (2 bits before) determination value $Y_{n-2}$ as a threshold. On the other hand, the decision circuit 31a-2 performs the binary determination (positive or negative sign determination) of the quantized signal $y_n$ taking as a threshold the value "0" set for a sign determination.

On the other hand, the switch 31e selects the threshold in the decision circuit 31a-1 above-mentioned by switching a way S1 from the decision circuit 31a-1 or a way S2 from the decision circuit 31a-2 based on a control signal from the disk controller 24.

In other words, when the switch 31e is switched to the way S1, it selects as a threshold the previous determination value in the decision circuit 31a-1 and when changed to the way S2, it selects as a threshold the sign determination value in the decision circuit 31a-2.

The decision circuit 35 performs a multi-valued (three-valued in this case) determination for the phase tracking by means of a given threshold (±½) for the quantized signal from the FIR filter 106.

The switch 36-1 selects an output signal from the A/D converter 105 upon the phase acquisition to output it, while it selects an output signal from the FIR filter 106 upon the phase tracking to output it, from the output signals from the A/D converter 105 and the output signal from the FIR filter 106, under control of the disk controller 24, for example.

Similarly, the switch 36-2 selects the determination value from the decision circuit 31a-1 upon the phase acquisition to output it while it selects the determination value from the decision circuit 35 upon the phase tracking to output it, from the determination value from the decision circuit 31a-1 and the determination value from the decision circuit 35, under control of the disk controller 24, for example.

By this, similarly as in the case of the first embodiment mentioned before, the threshold in the decision circuit 31a-1 is initialized upon the beginning of phase acquisition while, during the phase acquisition, the phase error $E_\tau$ may be operated by selecting the output signal from the A/D converter 105 and the determination value from the decision circuit 31a-1 by means of the switches 36-1 and 36-2.

Likewise, upon the phase tracking, the phase error $E_\tau$ can be operated using the output signal from the FIR filter 106 and the determination value from the decision circuit 35 by means of the switches 36-1 and 36-2.

In consequence, according to this modification, a loop delay occurred by the FIR filter 106 is prevented from affecting phase synchronization characteristics and, more particularly, when the PLL loop delay is important, the prolongation of the time required for the phase acquisition can be advantageously minimized.

In the clock phase acquisition/tracking device according to the respective embodiments mentioned before, as a decision circuit in the phase error operation section, it is adopted a decision circuit for simply performing the level determination about the quantized signal to be input; however, according to the present invention, in case of tracking operation where the response speed is not so important, the output from the maximum likelihood detector 111 can be used as the determination value for the operation of the phase error $E_\tau$.

Figure 19:
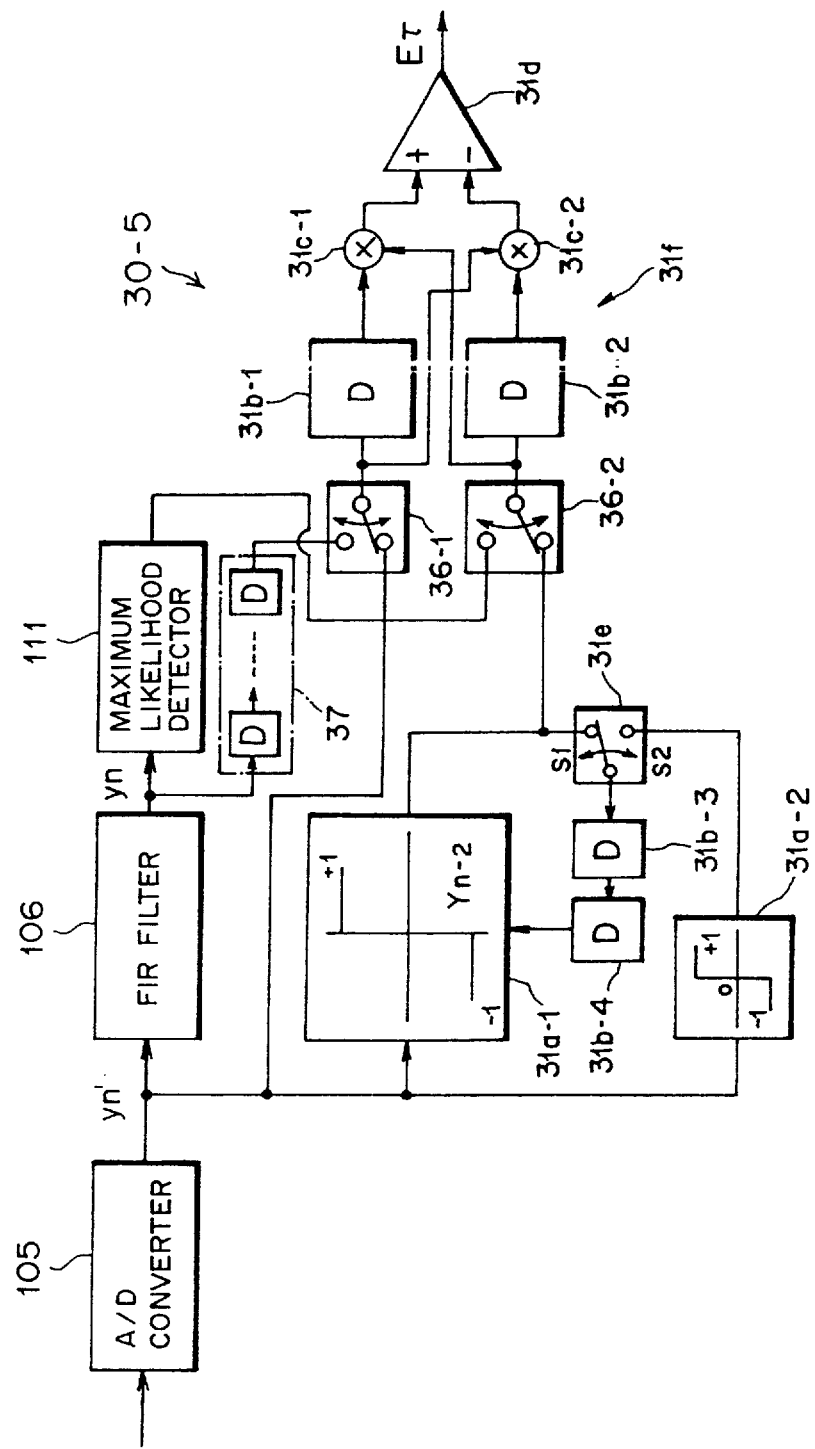

To be more specific, a clock phase acquisition/tracking device 30-5 as shown in FIG. 19 can be composed by using the detection signal from the maximum likelihood detector 111 as the determination value for operating the phase error $E_\tau$ upon the phase tracking as mentioned above, to a circuit having such functions similar to the clock phase acquisition/tracking device 30-1 according to the first embodiment.

Further, compared to that shown in FIG. 18 mentioned above (symbol 30-4), the clock phase acquisition/tracking device 30-5 shown in FIG. 19 is different only in that it does not use the determination value of the decision circuit 35 but the detection signal from the maximum likelihood detector 111 for the operation of the phase error $E_\tau$. In FIG. 19, the same symbols as in FIG. 18 indicate similar parts.

Numeral 37 indicates a delay element and this delay element 37 is specified for the synchronization of the output signal $y_n$ from the FIR filter 106 to be input into the switch 36-1 and the output signal $Y_n$ from the maximum likelihood detector 111 to be input into the switch 36-2. The delay element 37 delays the output signal from the FIR filter 106 by the period of time required for the maximum likelihood detection processing by the maximum likelihood detector 111 and outputs the signal.

Thus, the clock phase acquisition/tracking device 30-5 shown in FIG. 19 enables to perform the phase acquisition after the initialization of the threshold in the decision circuit 31a-1 upon the beginning of phase acquisition similarly as in the case of the first embodiment, while, upon the clock phase tracking, it can operate the phase error $E_\tau$ using the detection result from the maximum likelihood detector 111 and the sample value of the quantized signal from the FIR filter 106, in the operation section 31f.

Consequently, similarly to the case of the first embodiment, as the threshold in the decision circuit 31a-1 may be initialized upon the beginning of phase acquisition, the time required for the phase acquisition can be reduced and, moreover, as the phase error $E_\tau$ can be operated taking as a determination value the detection value from the maximum likelihood detector 111, in the operation section 31f, upon the clock phase tracking, the accuracy of the determination value can be remarkably increased and the accuracy of the phase tracking can be improved advantageously.

Further, in the clock phase acquisition/tracking device 30-5 shown in FIG. 19 mentioned before, the three-valued determination result (+1, 0, −1) can be obtained using the output from the maximum likelihood detector 111 through the provision of a function section for determining positive/negative sign of the quantized signal when the output from the maximum likelihood detector 111 is (0, 1), and for outputting a signal thereof.

Now, the clock phase acquisition/tracking device according to respective embodiments mentioned before presents the phase error characteristics (P1) and (P2) as shown in FIG. 20(b) respectively when the phase acquisition is performed and when the phase tracking is performed. Namely, as shown in FIG. 20(b), the error maximum value is about two times higher in the case of phase acquisition than in the case of phase tracking.

For instance, when the pre-filter 104 output (analog signal) to be input into the A/D converter 105 is at the level shown in FIG. 20(a), the A/D converter 105 is so composed to output, for example, converting into 6 bits digital signal as quantized signal.

Moreover, the phase error $E_\tau$ operated in the phase error operation section has data of which the maximum value is at least 7 bits upon the phase acquisition (Acquisition Mode) (refer to (P1) in FIG. 20(b)) but it has 6 bits data upon the phase tracking (Tracking Mode) (refer to (P2) in FIG. 20(b)).

In other words, when the bit width at the D/A conversion by the D/A converter 108 upon the phase acquisition is adjusted to the maximum value of the phase error $E_\tau$, in the D/A conversion processing upon the phase tracking needs only about ½ bit width in comparison with that upon the phase acquisition is required. Hence, about the half of circuits of the D/A converter 108 remains inactive uselessly.

On the contrary, if a limiter circuit 37 for limiting the maximum value of the phase error information $E_\tau$ from the phase error operation section 31 in the range that would not affect the phase acquisition is provided in the upstream stage of the D/A converter 108, the circuit resources used upon the phase tracking can be effectively utilized maintaining the circuit performance upon the phase acquisition.

Here, the limiter circuit 37 outputs to the D/A converter 108 in downstream stage only the lowest order m bits (m is a natural number smaller than n+1) by performing the limiter processing to the phase error information $E_\tau$ (n+1 bits; n is any natural number) input from the phase error operation section 31 and, thus, the phase error information $E_\tau$ of n+1 bits can be m bits smaller than n+1 bits.

In consequence, according to the present invention, the number of bits to be treated by the D/A converter 108 can be reduced while maintaining the circuit performance upon the phase acquisition, so this enables use of relatively simplified D/A converter 108 so as to reduce advantageously the cost for composing the device.

Moreover, in the clock phase acquisition/tracking device according to respective embodiments mentioned before, for example, the circuit resources used upon the phase tracking can be effectively exploited while maintaining the circuit performance required for the phase acquiring and phase tracking, by means of a ½ multiplication circuit 38 and a switch 39 provided in the upstream stage of the D/A converter 108.

Here, the ½ multiplication circuit 38 limits the bits number (n+1 bits) of the phase error information $E_\tau$ from the phase error operation section 31 to n bits by multiplying the phase error information $E_\tau$ from the phase error operation section 31 by ½ so as to function as a bits number limitation section.

The switch 39 receives as a control signal, a phase acquisition/tracking switching signal Q from the disk controller 24, for example, and outputs by selectively switching the phase error information $E_\tau$ (bit data) for the D/A converter 108 upon the phase acquisition or phase tracking.

To be more specific, based on the switching signal Q, the switch 39 outputs selectively the phase error information whose bits number is limited by the ½ multiplication circuit 38 (n bits while the phase error $E_\tau$ from the phase error operation section 31 being n+1 bits) upon the phase acquisition but it outputs selectively the phase error information $E_\tau$ from the phase error operation section 31 (by neglecting the higher order 1 bit) upon the phase tracking. Thus, the switch 39 functions as a phase error information selection section.

Namely, in the phase acquisition mode, the phase error $E_\tau$ will be larger than in the phase tracking mode; however, the phase error precision is not as much required as upon the phase tracking, thereby allowing performance of the phase control by using that multiplied by the ½ multiplication circuit 38 without inconvenience.

Moreover, in the D/A conversion upon the phase tracking mode, as the bit width of the phase error $E_\tau$ is required only about ½ of the case of the phase acquisition, the highest order 1 bit may be neglected without inconvenience.

Figure 22:
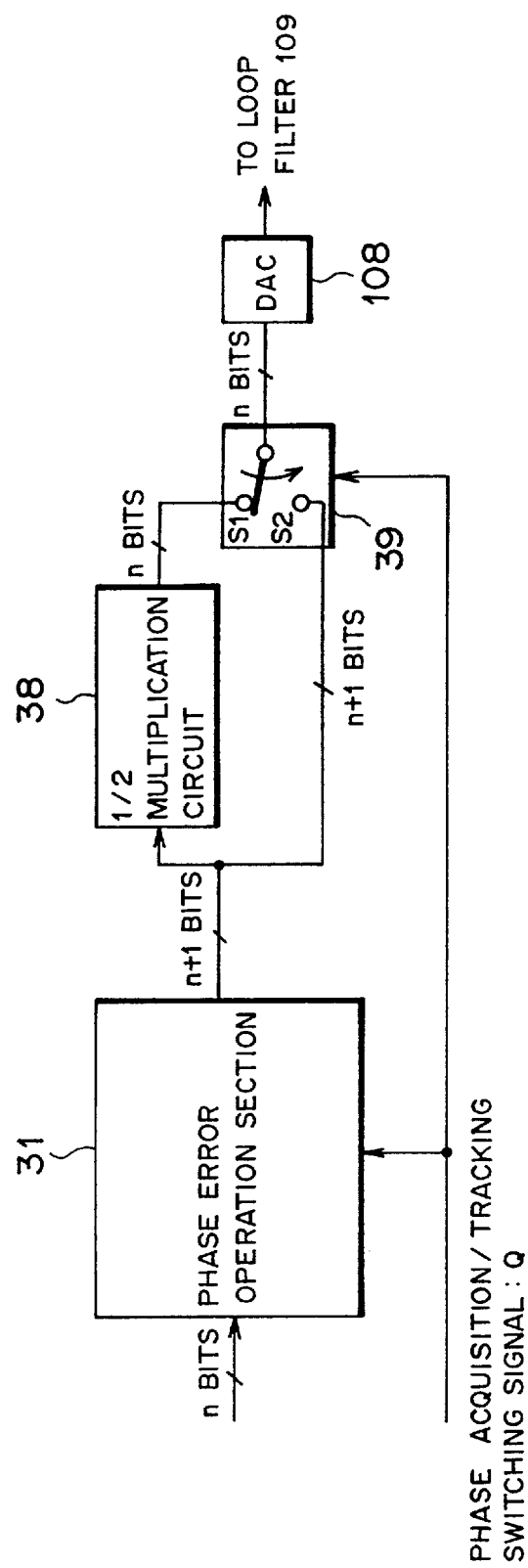

Consequently, in the present invention shown in FIG. 22, as the bits number of the phase error information $E_\tau$ upon the phase acquisition can be limited to n bits while maintaining the circuit performance required for the phase acquisition and, upon the phase tracking, the bits number treated by the D/A converter 108 may be reduced to n bits by outputting the lower order n bits neglecting the highest order 1 bit, a simple D/A converter 108 can be adopted relatively and it is possible to advantageously reduce the cost for composing the device.

Additionally, in the clock phase acquisition/tracking device according to respective embodiments mentioned before, the circuit resources used upon the phase tracking may be exploited effectively while maintaining the circuit performance required for the phase acquisition and phase tracking, by means of a $2_{-(n-m+1)}$ multiplication circuit 38A, a limiter 37 and a switch 40 provided in the upstream stage of the D/A converter 108.

Here, the $2_{-(n-m+1)}$ multiplication circuit 38 limits the bits number (n+1 bits) of the phase error information $E_\tau$ from the phase error operation section 31 to m bits by multiplying the phase error information $E_\tau$ from the phase error operation section 31 by $2_{-(n-m+1)}$ so as to function as a bits number limitation section.

Furthermore, the limiter circuit 37 outputs to the downstream stage D/A converter 108 only the lower order m bits (m is a natural number smaller than n+1) by performing a limiting process for limiting the maximum value of the phase error information $E_\tau$ (n+1 bits; n is any natural number) input from the phase error operation section 31 and, thus, the phase error information $E_\tau$ of n+1 bits can be changed to m bits smaller than n+1 bits.

The switch 40 also receives as a control signal, for instance, a phase acquisition/tracking switching signal Q from the disk controller 24 and outputs by selectively switching the phase error information $E_\tau$ (bit data) for the D/A converter 108 upon phase acquisition or phase tracking.

To be more specific, based on the switching signal Q, the switch 40 outputs selectively a phase error information whose bits number is limited by the $2_{-(n-m+1)}$ multiplication circuit 38 upon the phase acquisition but, outputs selectively the phase error information from the limiter circuit 37 upon the phase tracking. Thus, the switch 40 functions as a phase error information selection section.

Figure 23:
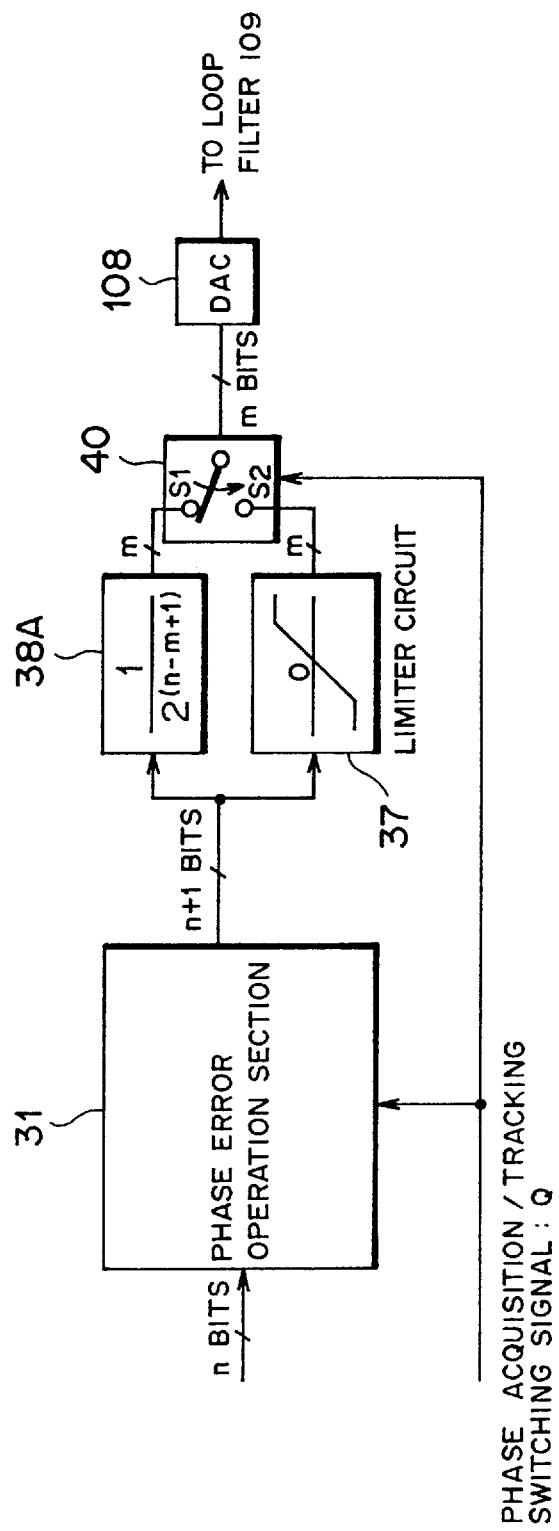

Consequently, in the present invention shown in FIG. 23, as the bits number of the phase error information $E_\tau$ upon the phase acquisition can be limited while maintaining the circuit performance required for the phase acquisition and, upon the phase tracking, the bits number treated by the D/A converter 108 can be reduced to m bits by outputting after performing the necessary limiting process, thereby the D/A converter 108 simplified as necessary may be adopted and it is possible to advantageously reduce the cost for composing the device.

Figure 21:
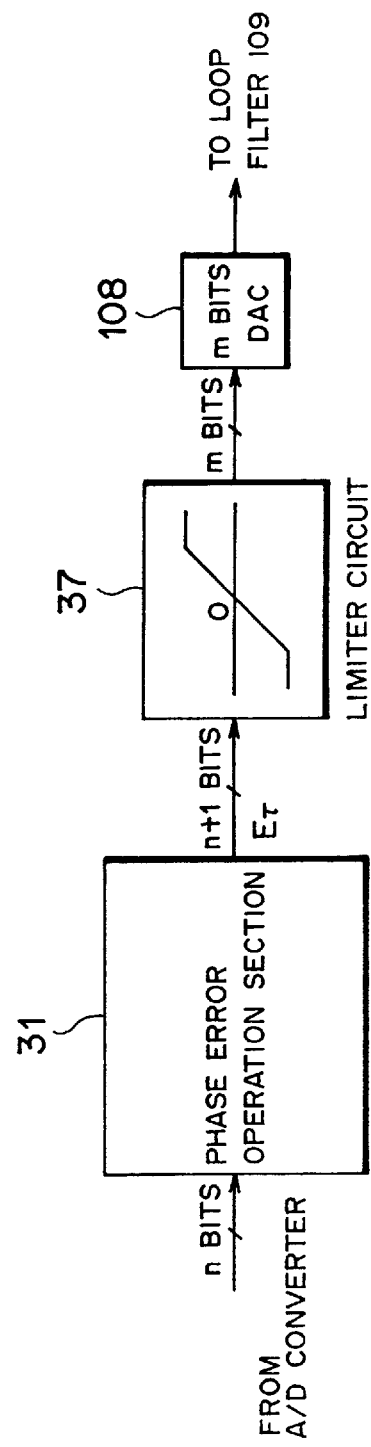
FIG. 21 to FIG. 23 are all block diagrams showing variations of the respective embodiments of the invention.

Further, it goes without saying that the limiter circuit 37, the ½ multiplication section 38, the switch 39 and the $2_{-(n-m+1)}$ multiplication circuit 38A shown in FIG. 21 to FIG. 23 mentioned above can be provided at the upstream stage D/A converter 108 of the clock phase acquisition/tracking device according to any embodiments mentioned before and that the same advantage as the case of each embodiment can be obtained also in such composition.

(g) Others

In each embodiment mentioned before, an A/D converter is employed as a quantization section for quantizing the output of the pre-filter 104 as an input signal; however, other than this, a sample holder can be also employed for holding an analog signal for a certain period of time.

Moreover, in each of the above embodiments is described about its application to the data read in a magnetic recording device, it is not limited to this but the present invention can also well be applied to a clock phase acquisition/tracking device for the regeneration of received signal in a communication device, for example and, in this case also, substantially similar advantages as respective embodiments mentioned before may be obtained.

What is claimed is:

1. A clock phase acquisition/tracking device for acquiring or tracking a phase of a clock for quantization of an input signal from a signal to which said quantization was made, comprising:

a phase error operation section for operating phase error of said quantized signal to a given quantized timing; and a clock generation section for generating the clock at a given phase based on a phase error information operated in said phase error operation section;

wherein, as for the signal to which the quantization was made, determination is made using a threshold set based on a previously quantized signal when the phase error is operated by said phase error operation section upon beginning of the clock phase acquisition.

2. The clock phase acquisition/tracking device according to claim 1, wherein said phase error operation section comprises:
- a determination section for receiving said quantized signal and for determining whether a sample value of said signal is bigger or smaller than a threshold;
- an operation section for operating the phase error using a determination result of said determination section and the sample value of the signal and for outputting the operation result to said clock generation section; and
- a threshold setting section for setting the threshold to be used when said determination is made in said determination section based on said quantized signal upon beginning of said clock phase acquisition.

3. The clock phase acquisition/tracking device according to claim 2, wherein
said threshold setting section is composed to set as the threshold a determination result of a sample value of a previous signal input previously to the signal upon clock phase acquisition.

4. The clock phase acquisition/tracking device according to claim 2, wherein
said threshold setting section comprises:
- a sign determination section for determining whether the signal sample value is bigger or smaller than a given sign determination reference value; and
- a switch section for setting as the threshold the determination result from said sign determination section upon beginning of the clock phase acquisition and, on the other hand, for setting as the threshold the determination result of a sample value of a previous signal input previously to the signal upon clock phase acquisition.

5. The clock phase acquisition/tracking device according to claim 4, wherein
said given sign determination reference value is a value enabling determination of a positive or negative sign of the signal.

6. The clock phase acquisition/tracking device according to claim 2, wherein
said threshold setting section comprises:
- a switch section for setting in said determination section a value for sign determination about the signal sample value upon beginning of the clock phase acquisition and for selecting the determination result about a sample value of a previous signal input before the sample value upon clock phase acquisition.

7. The clock phase acquisition/tracking device according to claim 2, wherein
said clock generation section is composed to generate a plurality of clocks having different phases from each other and comprises a clock selection section for outputting selectively the plurality of clocks based on the level of the signal quantized.

8. The clock phase acquisition/tracking device according to claim 7, wherein
the plurality of clocks having different phases from each other are two clocks having antiphased relation to each other.

9. The clock phase acquisition/tracking device according to claim 2, wherein
said threshold setting section is set by switching a threshold of said determination section to a threshold for the clock phase tracking upon the completion of the clock phase acquisition.

10. The clock phase acquisition/tracking device according to claim 9, wherein
the threshold for said clock phase tracking is composed to be set to a value enabling performance of three-valued determination.

11. A clock phase acquisition/tracking device for acquiring or tracking a phase of a clock for quantization of an input signal from a signal to which the quantization was made, comprising:
- a clock generation section for generating a plurality of clocks having a different phases from each other;
- a determination section for receiving a signal quantized by the clocks from said clock generation section and for performing multivalued determination of a sample value of the signal using a given threshold;
- an operation section for operating a phase error to a given quantization timing about the quantized signal using the determination result in said determination section and the sample value of the signal and for outputting the phase error information as phase control information to said clock generation section, and
- a clock decision section for deciding which one of the plurality of clocks will perform clock phase tracking based on a determination result from said determination section when said clock phase acquisition results in a stability state.

12. The clock phase acquisition/tracking device according to claim 11, wherein
the plurality of clocks having different phases from each other are two clocks having antiphased relation to each other; and
the threshold in said determination section is set to a value enabling performance of a three-valued determination.

13. A clock phase acquisition/tracking device for acquiring or tracking of a phase of a clock for quantization of an input signal from a signal to which the quantization was made, comprising:
- a phase error operation section for operating phase error to a given quantization timing of the quantized signal; and
- a clock generation section for generating the clock at a given phase based on a phase error information operated in said phase error operation section, wherein
said phase error operation section comprises:
  - a determination unit for receiving the quantized signal and for determining whether a sample value of said signal is bigger or smaller than a threshold;
  - an operation unit for operating the phase error using a determination result of said determination unit and the sample value of said signal and for outputting the operation result to said clock generation section; and
  - a threshold setting unit for setting a sample value of previously input signal upon the phase clock acquisition and for setting a value enabling performance of multi-valued determination upon the clock phase tracking.

14. The clock phase acquisition/tracking device according to claim 1, which is composed to perform a clock phase tracking from a signal obtained as a result of a desired signal processing after the quantization upon completion of the phase acquisition.

15. The clock phase acquisition/tracking device according to claim 11, which is composed to perform a clock phase tracking from a signal obtained as a result of a desired signal processing after the quantization upon completion of the phase acquisition.

16. The clock phase acquisition/tracking device according to claim 13, which is composed to perform a clock phase tracking from a signal obtained as a result of a desired signal processing after the quantization upon completion of the phase acquisition.

17. The clock phase acquisition/tracking device according to claim 14, wherein the desired signal processing after the quantization is an equalization processing.

18. The clock phase acquisition/tracking device according to claim 15, wherein the desired signal processing after the quantization is an equalization processing.

19. The clock phase acquisition/tracking device according to claim 16, wherein the desired signal processing after the quantization is an equalization processing.

20. The clock phase acquisition/tracking device according to claim 1, comprising:

a maximum likelihood detector for detecting a maximum likelihood of the equalized signal; wherein said phase error operation section is composed to operate the phase error using a detection result from said maximum likelihood detector and the signal sample value upon performing the clock phase tracking.

21. The clock phase acquisition/tracking device according to claim 11, comprising:

a maximum likelihood detector for detecting a maximum likelihood of the equalized signal; wherein said phase error operation section is composed to operate the phase error using a detection result from said maximum likelihood detector and the signal sample value upon performing the clock phase tracking.

22. The clock phase acquisition/tracking device according to claim 13, comprising:

a maximum likelihood detector for detecting a maximum likelihood of the equalized signal; wherein the phase error operation section is composed to operate the phase error using a detection result from said maximum likelihood detector and the signal sample value upon performing the clock phase tracking.

23. The clock phase acquisition/tracking device according to claim 1, wherein an analog/digital converter for converting an analog signal into a digital signal is composed to quantize the input signal, and a digital/analog converter for converting a digital signal about a phase error information from said phase error operation section into an analog signal is disposed at an upstream stage of said clock signal generation section.

24. The clock phase acquisition/tracking device according to claim 11, wherein an analog/digital converter for converting an analog signal into a digital signal is composed to quantize the input signal, and a digital/analog converter for converting a digital signal about the phase error information from said phase error operation section into an analog signal is disposed at an upstream stage of said clock signal generation section.

25. The clock phase acquisition/tracking device according to claim 13, wherein an analog/digital converter for converting an analog signal into a digital signal is composed to quantize the input signal, and a digital/analog converter for converting a digital signal about the phase error information from said phase error operation section into an analog signal is disposed at an upstream stage of said clock signal generation section.

26. The clock phase acquisition/tracking device according to claim 23, wherein a limiter circuit for limiting a maximum value of phase error information from said phase error operation section is disposed at an upstream stage of said digital/analog converter.

27. The clock phase acquisition/tracking device according to claim 24, wherein a limiter circuit for limiting a maximum value of phase error information from said phase error operation section is disposed at an upstream stage of said digital/analog converter.

28. The clock phase acquisition/tracking device according to claim 25, wherein a limiter circuit for limiting a maximum value of phase error information from said phase error operation section is disposed at an upstream stage of said digital/analog converter.

29. The clock phase acquisition/tracking device according to claim 23, further comprising:

a bits number limitation section for limiting bits number of a phase error information from said phase error operation section, and a phase error information selection section for selectively outputting a phase error information of which bits number is limited by said bits number limitation section upon phase acquisition and for selectively outputting a phase error information from said phase error operation section upon phase tracking, the bits number limitation section and phase error information selection section are disposed at an upstream stage of said digital/analog converter.

30. The clock phase acquisition/tracking device according to claim 24, further comprising:

a bits number limitation section for limiting bits number of a phase error information from said phase error operation section, and a phase error information selection section for selectively outputting a phase error information of which bits number is limited by said bits number limitation section upon phase acquisition and for selectively outputting a phase error information from said phase error operation section upon phase tracking, the bits number limitation section and phase error information selection section are disposed at an upstream stage of said digital/analog converter.

31. The clock phase acquisition/tracking device according to claim 25, further comprising:

a bits number limitation section for limiting bits number of the phase error information from said phase error operation section, and a phase error information selection section for selectively outputting a phase error information of which bits number is limited by said bits number limitation section upon phase acquisition and for selectively outputting a phase error information from said phase error operation section upon phase tracking, the bits number limitation section and phase error information selection section are disposed at an upstream stage of said digital/analog converter.

32. The clock phase acquisition/tracking device according to claim 23, further comprising:

a bits number limitation section for limiting bits number of the phase error information from said phase error operation section, a limiter circuit for limiting a maximum value of phase error information from said phase error operation section, and a phase error information selection section for selectively outputting the phase error information from said bits number limitation section upon phase acquisition and for selectively outputting the phase error information from said limiter circuit section upon phase tracking, the bit number limitation section limiter circuit and phase error information selection section are disposed at an upstream stage of said digital/analog converter.

33. The clock phase acquisition/tracking device according to claim 24, further comprising:

a bits number limitation section for limiting bits number of a phase error information from said phase error operation section, a limiter circuit for limiting a maximum value of phase error information from said phase error operation sections and a phase error information selection section for selectively outputting the phase error information from said bits number limitation section phase acquisition and for selectively outputting the phase error information from said limiter circuit section upon said phase tracking, the bit number limitation section, limiter circuit and phase error information selection section are disposed at an upstream stage of said digital/analog converter.

34. The clock phase acquisition/tracking device according to claim 25, further comprising:

a bits number limitation section for limiting bits number of a phase error information from said phase error operation section, a limiter circuit for limiting a maximum value of phase error information, and a phase error information selection section for selectively outputting the phase error information from said bits number limitation section upon phase acquisition and for selectively outputting the phase error information from said limiter circuit section upon phase tracking, the bit number limitation section, limiter circuit and phase error information selection section are disposed at an upstream stage of said digital/analog converter.

35. A phase acquisition method for acquiring from a quantized signal a clock phase for quantization of an input signal, comprising steps of:

determining whether or not a sample value of a signal quantized based on a clock signal is larger than a threshold of the sample value of a previous signal previous to the sample value of the signal;

operating a phase error between a given phase and a sample phase of said signal using the determination result of said determining step and a sample value of the input signal;

controlling a phase of the clock signal based on the phase error information operated in said operating step; and initializing said threshold according to the sample value of the quantized signal when the determination is initiated in said determining step.

* * * * *

UNITED STATES PATENT AND TRADEMARK OFFICE
CERTIFICATE OF CORRECTION

PATENT NO. : 5,892,474
DATED : April 6, 1999
INVENTOR(S) : Takao Sugawara

It is certified that error appears in the above-identified patent and that said Letters Patent is hereby corrected as shown below:

Title page,

Under "[56] References Cited" delete

"6/1988" and insert --7/1988-- therefor

Column 1, line 63, delete "112, from" and insert --112, and from a-- therefor

Column 2, line 50, delete "$(y_{n-3}, y_n)$" and insert --$(Y_{n-1}, Y_n)$-- therefor Column 3, line 8, delete " $(Y_{n-1}, y_n)$ and insert --$(Y_{n-1}, Y_n)$-- therefor Column 3, line 38, delete "sometime," and insert --,-- therefor

UNITED STATES PATENT AND TRADEMARK OFFICE
CERTIFICATE OF CORRECTION

PATENT NO. : 5,892,474
DATED : April 6, 1999
INVENTOR(S) : Takao Sugawara

It is certified that error appears in the above-identified patent and that said Letters Patent is hereby corrected as shown below:

Column 5, line 3, delete "an" and insert --than-- therefor

Column 6, line 44, delete "signal" and insert --signals-- therefor

Column 6, line 61, before "which" insert --the--

Column 9, lines 49-50, insert --which-- before "can" and insert --to-- before "each"

Column 10, line 1, before "signal" insert --a-- therefor

Column 10, line 57, before "analog" insert --an--

UNITED STATES PATENT AND TRADEMARK OFFICE
CERTIFICATE OF CORRECTION

PATENT NO. : 5,892,474
DATED : April 6, 1999
INVENTOR(S) : Takao Sugawara

It is certified that error appears in the above-identified patent and that said Letters Patent is hereby corrected as shown below:

Column 10, line 57, before "digital" insert

--a-- therefor

Column 10, line 58, before "digital" insert

--a--

Column 10, line 58, before "analog" insert

--an-- therefor

Column 12, line 6, delete "a" and insert

--an-- therefor

UNITED STATES PATENT AND TRADEMARK OFFICE
CERTIFICATE OF CORRECTION

PATENT NO. : 5,892,474
DATED : April 6, 1999
INVENTOR(S) : Takao Sugawara

It is certified that error appears in the above-identified patent and that said Letters Patent is hereby corrected as shown below:

Column 12, line 60, before "parallel" insert --a-- therefor

Column 13, line 39, delete "circuit" and insert --circuits-- therefor

Column 15, line 45, after "8(d)" insert --.--

Column 16, line 2, delete "reduces" and insert --reduced-- therefor

Column 17, line 17, delete "other" and insert --another-- therefor

Column 17, line 40, delete "comprise" and insert --comprises-- therefor

UNITED STATES PATENT AND TRADEMARK OFFICE
CERTIFICATE OF CORRECTION

PATENT NO. : 5,892,474  
DATED : April 6, 1999  
INVENTOR(S) : Takao Sugawara

Page 5 of 6

It is certified that error appears in the above-identified patent and that said Letters Patent is hereby corrected as shown below:

Column 18, line 20, before "each" insert

--than--

Column 18, line 23, after "as" insert --the--

Column 18, line 28, before "each" insert

--than--

Column 22, line 19, delete "the"

Column 23, line 28, delete "occurred by"

and insert --occuring due to-- therefor

Column 24, line 22, after "determining"

insert --the--

Column 24, line 50, after "of" insert --the--

UNITED STATES PATENT AND TRADEMARK OFFICE
CERTIFICATE OF CORRECTION

PATENT NO. : 5,892,474
DATED : April 6, 1999
INVENTOR(S) : Takao Sugawara

It is certified that error appears in the above-identified patent and that said Letters Patent is hereby corrected as shown below:

Column 24, line 51, delete "remains" and insert --remain-- therefor

Column 26, line 47, delete "Well"

Column 28, line 11, delete "a"

Column 31, lines 20-21, "sections" should be --section,--

Signed and Sealed this

Twentieth Day of June, 2000

Attest:

Attesting Officer

Q. TODD DICKINSON

Director of Patents and Trademarks